(12) United States Patent
Ishikura et al.

(10) Patent No.: US 8,665,637 B2
(45) Date of Patent: Mar. 4, 2014

(54) SEMICONDUCTOR MEMORY

(75) Inventors: Satoshi Ishikura, Osaka (JP); Norihiko Sumitani, Osaka (JP)

(73) Assignee: Panasonic Corporation, Osaka (JP)

( * ) Notice: Subject to any disclaimer, the term of this patent is extended or adjusted under 35 U.S.C. 154(b) by 5 days.

(21) Appl. No.: 13/620,538

(22) Filed: Sep. 14, 2012

(65) Prior Publication Data

US 2013/0021839 A1    Jan. 24, 2013

Related U.S. Application Data

(63) Continuation of application No. PCT/JP2011/001076, filed on Feb. 24, 2011.

(30) Foreign Application Priority Data

May 21, 2010 (JP) .................................. 2010-117748

(51) Int. Cl.
 *G11C 11/00* (2006.01)
 *G11C 11/412* (2006.01)

(52) U.S. Cl.
 CPC .................................. *G11C 11/412* (2013.01)
 USPC .................. 365/154; 365/189.05; 365/189.11; 365/189.07; 365/230.05

(58) Field of Classification Search
 CPC ...... G11C 11/406; G11C 8/18; G11C 7/1072; G11C 11/4085; G11C 8/16; G11C 7/1051
 USPC .................. 365/189.05, 154, 189.11, 189.07, 365/230.05
 See application file for complete search history.

(56) References Cited

U.S. PATENT DOCUMENTS

| | | | |
|---|---|---|---|
| 5,070,482 A | 12/1991 | Miyaji | |
| 5,140,557 A | 8/1992 | Yoshida | |
| 6,310,808 B1 | 10/2001 | Tanizaki | |
| 7,161,868 B2 * | 1/2007 | Morishima | ............. 365/230.05 |
| 2003/0026124 A1 | 2/2003 | Nagaoka | |
| 2006/0171188 A1 | 8/2006 | Kawasumi | |
| 2008/0094879 A1 | 4/2008 | Masuo | |

(Continued)

FOREIGN PATENT DOCUMENTS

| | | |
|---|---|---|
| JP | 2-265097 A | 10/1990 |
| JP | 3-101163 A | 4/1991 |

(Continued)

OTHER PUBLICATIONS

M. Yabuuchi et al., "A 45nm 0.6V cross-point 8T SRAM with negative biased read/write assist", 2009 Symposium on VLSI Circuits Digest of Techical Papers, Jun. 16-18, 2009, pp. 158-159.

(Continued)

*Primary Examiner* — Thong Q Le
(74) *Attorney, Agent, or Firm* — McDermott Will & Emery LLP

(57) ABSTRACT

A semiconductor memory includes a plurality of memory cells. The plurality of memory cells each include a latch having two inverters, where an input node and an output node of one of the inverters are respectively coupled to an output node and to an input node of the other one of the inverters, a first switch coupled in series with the latch between a first and a second power sources, and a second switch coupled in parallel with the first switch.

22 Claims, 30 Drawing Sheets

(56) References Cited

U.S. PATENT DOCUMENTS

| | | |
|---|---|---|
| 2008/0151653 A1 | 6/2008 | Ishikura et al. |
| 2009/0231908 A1 | 9/2009 | Uematsu |
| 2009/0244950 A1 | 10/2009 | Nii |

FOREIGN PATENT DOCUMENTS

| | | |
|---|---|---|
| JP | 9-045081 A | 2/1997 |
| JP | 2001-184868 A | 7/2001 |
| JP | 2001-202782 A | 7/2001 |
| JP | 2003-045187 A | 2/2003 |
| JP | 2005-302121 A | 10/2005 |
| JP | 2006-209945 A | 8/2006 |
| JP | 2008-047180 A | 2/2008 |
| JP | 2008-103028 A | 5/2008 |
| JP | 2008-176910 A | 7/2008 |
| JP | 2009-217895 A | 9/2009 |
| JP | 2009-238332 A | 10/2009 |

OTHER PUBLICATIONS

Chang et al., "A differential data aware power-supplied ($D^2AP$) 8T SRAM cell with expanded write/read stabilities for lower VDDmin applications", 2009 Symposium on VLSI Circuits Digest of Techical Papers, Jun. 16-18, 2009, pp. 156-157.

International Search Report issued in International Application No. PCT/JP2011/001076 issued on May 10, 2011.

* cited by examiner

| OPERATION | | NUMBER OF SWITCHES TO BE TURNED ON | SW23 | SW24 |
|---|---|---|---|---|
| READ | | 2 | ON | ON |
| WRITE | TARGET CELL | 0 | OFF | OFF |
| | OTHER CELLS IN SELECTED ROW | 1 | OFF | ON |
| | OTHER CELLS IN SELECTED COLUMN | 1 | ON | OFF |
| CELLS NOT IN SELECTED ROW NOR IN SELECTED COLUMN | | 2 | ON | ON |

| OPERATION | | NUMBER OF SWITCHES TO BE TURNED ON | SW23 | SW24 |
|---|---|---|---|---|
| READ | | 1 | OFF | ON |
| WRITE | TARGET CELL | 0 | OFF | OFF |
| | OTHER CELLS IN SELECTED ROW | 1 | OFF | ON |
| | OTHER CELLS IN SELECTED COLUMN | 1 | ON | OFF |
| CELLS NOT IN SELECTED ROW NOR IN SELECTED COLUMN | | 2 | ON | ON |

FIG.11

| OPERATION | | | NUMBER OF SWITCHES TO BE TURNED ON | SW23 | SW24 |
|---|---|---|---|---|---|
| NO CONCURRENT READ AND WRITE | SIMPLE READ OPERATION | | 2 | ON | ON |
| | SIMPLE WRITE OPERATION | | 0 | OFF | OFF |
| CONCURRENT READ AND WRITE | CELLS IN SELECTED ROW | W CELL | 0 | OFF | OFF |
| | | R CELL | 1 | OFF | ON |
| | CELLS IN SELECTED COLUMN | W CELL | 0 | OFF | OFF |
| | | R CELL | 1 | ON | OFF |
| CELLS NOT IN SELECTED ROW NOR IN SELECTED COLUMN | | | 2 | ON | ON |
| STANDBY MODE | | | 0 | OFF | OFF |

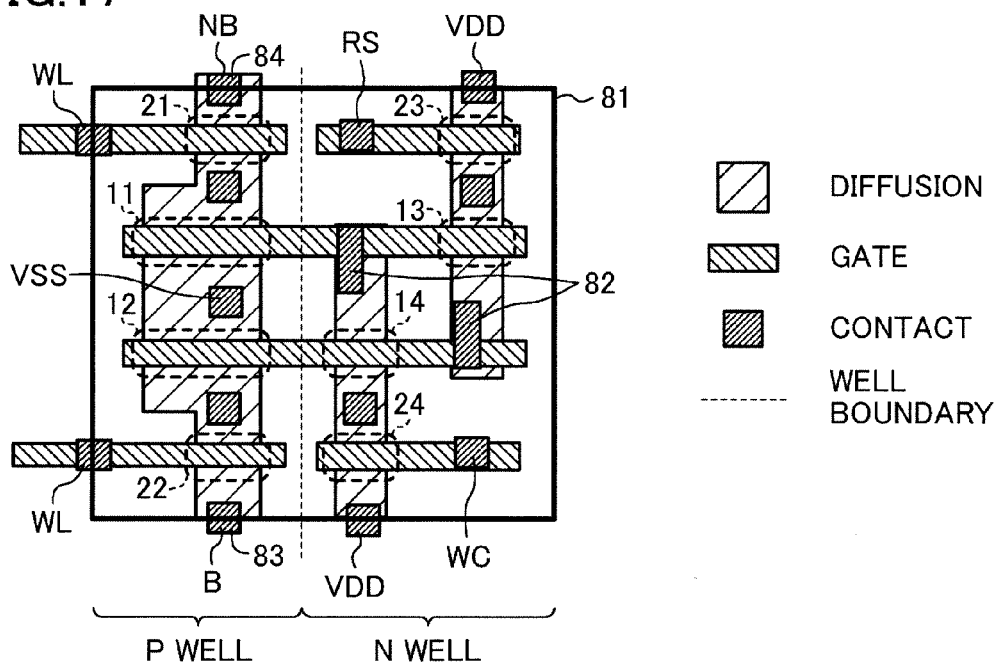
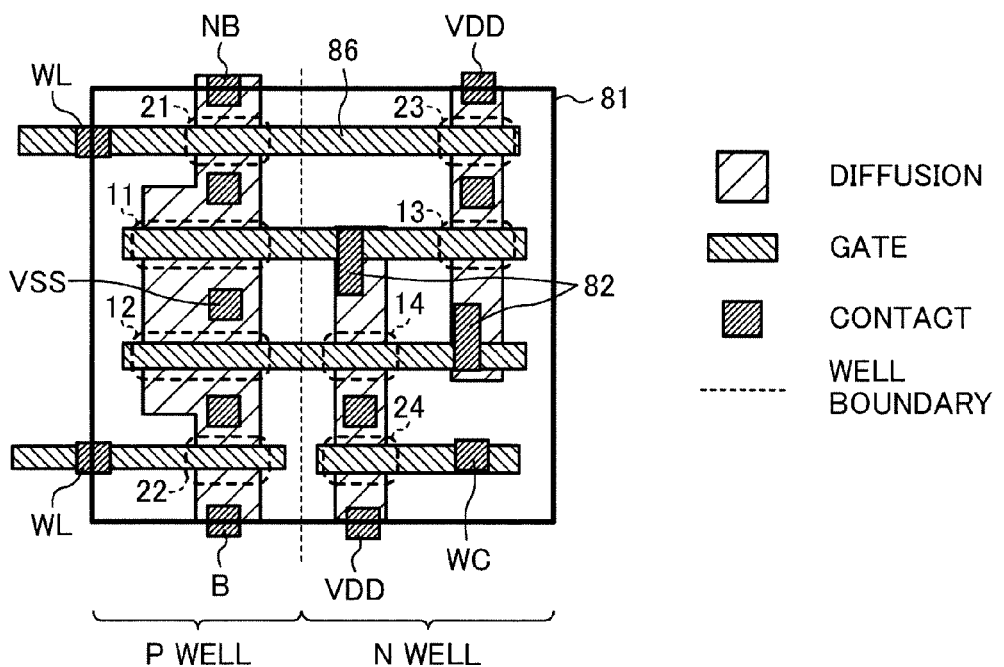

FIG.28
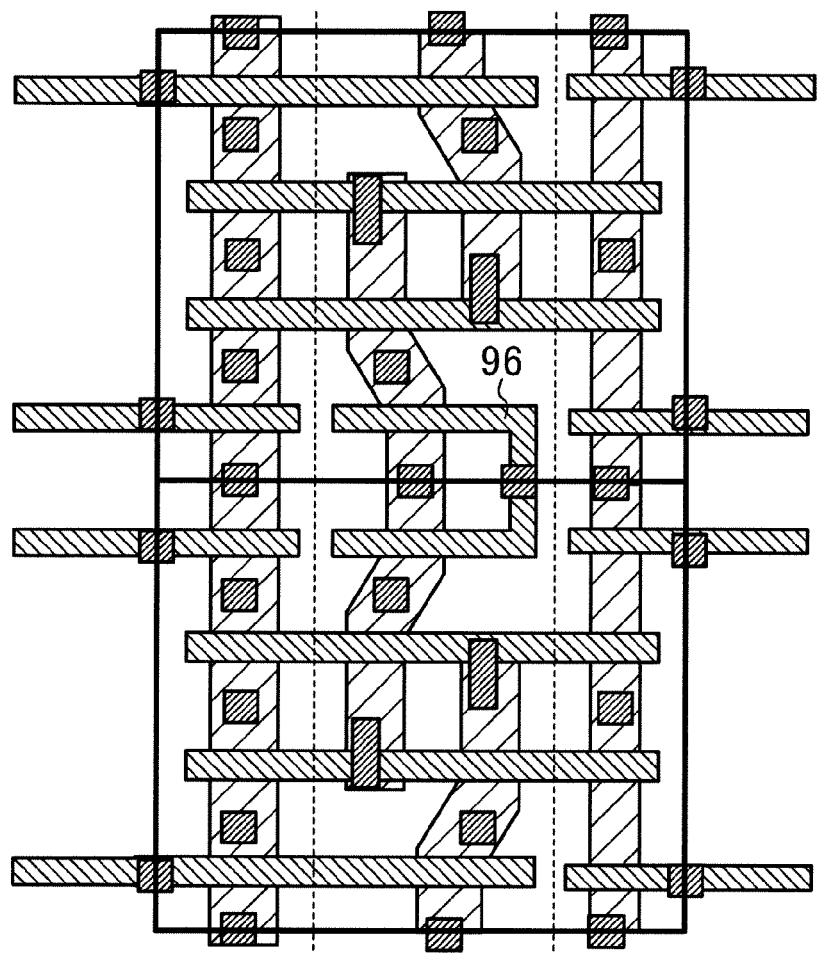
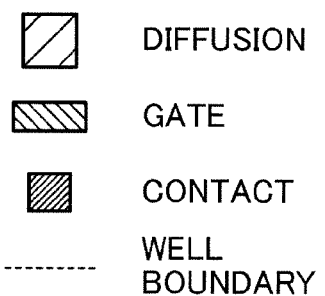

RWL

○ V2
▨ M3

▨ V1
— M2

SEMICONDUCTOR MEMORY

CROSS-REFERENCE TO RELATED APPLICATION

This is a continuation of PCT International Application PCT/JP2011/001076 filed on Feb. 24, 2011, which claims priority to Japanese Patent Application No. 2010-117748 filed on May 21, 2010. The disclosures of these applications including the specifications, the drawings, and the claims are hereby incorporated by reference in its entirety.

BACKGROUND

The present disclosure relates to semiconductor memories, and more particularly to static random-access memories (SRAMs).

Memory cells are required to exhibit two conflicting types of characteristics: one is excellent data retention characteristics, which ensure that stored data will not be easily lost, and the other is excellent write characteristics, which enable data to be easily rewritten. Variation in device characteristics is a major factor in these characteristics. It is known that a reduction in cell area results in a greater variation in device characteristics. Thus, it is becoming more difficult to keep the characteristics of the memory cell while reducing the cell area.

In general, when data in an SRAM cell is rewritten, an electrical charge is caused to flow from a latch in the cell to a bit line to invert the data in the latch. However, a current supplied from a power source to the latch interferes with this current flow. A large variation in characteristics of transistors included in the memory cell, and/or a low supply voltage, may create difficulties in rewriting data.

Japanese Patent Publication No. H09-045081 (Patent Document 1) describes an example of a memory having a switch between a power source and a memory cell. This memory improves write characteristics by interrupting power supply to memory cells on a row-by-row basis during a write operation.

SUMMARY

However, interruption of power supply such as described in Patent Document 1 may reduce the potential of a node due to junction leakage current etc. in other memory cells in the same row as the memory cell to be written into, which may result in loss of the data stored.

It is an object of the present disclosure to provide a semiconductor memory which achieves an easy rewrite operation to memory cells, and at the same time has excellent data retention characteristics.

According to the present disclosure, a semiconductor memory includes a plurality of memory cells arranged in a matrix format, a plurality of word lines each corresponding to a row of the plurality of memory cells, and each coupled to memory cells in the corresponding row, a plurality of bit line pairs each corresponding to a column of the plurality of memory cells, and each coupled to memory cells in the corresponding column, a plurality of row-control signal lines each corresponding to a row of the plurality of memory cells, and a plurality of column-control signal lines each corresponding to a column of the plurality of memory cells. The plurality of memory cells each include a latch having a first and a second inverters, where an input node and an output node of one of the first inverter or the second inverter are respectively coupled to an output node and to an input node of the other one of the first inverter or the second inverter, a first access transistor having a source coupled to one bit line of a bit line pair, which corresponds to that memory cell, of the plurality of bit line pairs, a drain coupled to a first output node which is the output node of the first inverter, and a gate coupled to a word line, which corresponds to that memory cell, of the plurality of word lines, a second access transistor having a source coupled to the other bit line of the bit line pair, which corresponds to that memory cell, a drain coupled to a second output node which is the output node of the second inverter, and a gate coupled to the word line, which corresponds to that memory cell, a first switch coupled in series with the latch between a first and a second power sources, and a second switch coupled in parallel with the first switch. The first switch is coupled to a row-control signal line, which corresponds to that memory cell, of the plurality of row-control signal lines, and the second switch is coupled to a column-control signal line, which corresponds to that memory cell, of the plurality of column-control signal lines.

According to the example embodiments of the present disclosure, a rewrite operation to memory cells can be easily performed, and also, a memory cell can have excellent data retention characteristics.

BRIEF DESCRIPTION OF THE DRAWINGS

FIG. 11 is a diagram illustrating an example of states of the switches in the memory cell of FIG. 10.

FIG. 17 is a layout diagram illustrating an example layout of the memory cell of FIG. 2.

FIG. 18 is a layout diagram illustrating an example layout of the memory cell of FIG. 6.

FIG. 28 is a layout diagram illustrating an example layout of a memory cell array, generated by combining the variation of the layout of FIG. 25.

DETAILED DESCRIPTION

Figure 1:
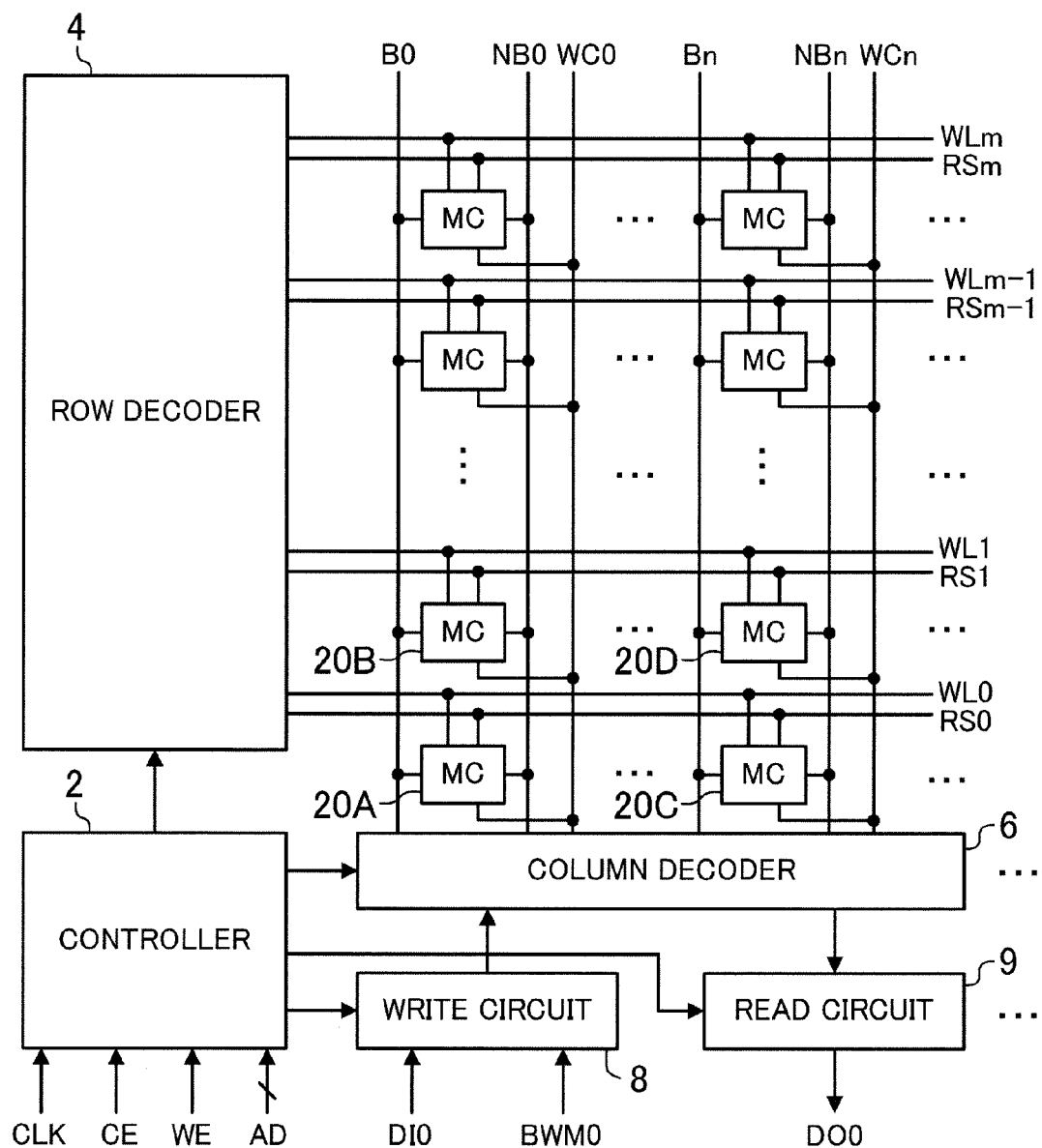
FIG. 1 is a block diagram illustrating an example configuration of a semiconductor memory according to the present invention.

Example embodiments of the present invention will be described below with reference to the drawings, in which like reference characters indicate the same or similar components.

FIG. 1 is a block diagram illustrating an example configuration of a semiconductor memory according to the present invention. The semiconductor memory of FIG. 1 includes a controller 2, a row decoder 4, a column decoder 6, a write circuit 8, a read circuit 9, m×n (where m and n are each an integer greater than or equal to 2) memory cells 20A, 20B, 20C, 20D, . . . arranged in a matrix format, word lines WL0, WL1, . . . , WLm−1, and WLm, row-control signal lines RS0, RS1, . . . , RSm−1, and RSm, bit lines B0, NB0, . . . , Bn, and NBn, and column-control signal lines WC0, . . . , and WCn. The bit lines Bj and NBj (j is an integer satisfying 0≤j≤n) constitute a bit line pair.

The word lines WL0-WLm each correspond to a row of the memory cells 20A, 20B, . . . , and are each coupled to the memory cells of the corresponding row. The bit line pairs of FIG. 1 each correspond to a column of the memory cells 20A, 20B, . . . , and are each coupled to the memory cells of the corresponding column. The row-control signal lines RS0-RSm each correspond to a row of the memory cells 20A, 20B, . . . , and are each coupled to the memory cells of the corresponding row. The column-control signal lines WC0-WCn each correspond to a column of the memory cells 20A, 20B, . . . , and are each coupled to the memory cells of the corresponding column. The row decoder 4 controls the word lines WL0-WLm and the row-control signal lines RS0-RSm, while the column decoder 6 controls the bit line pairs B0 and NB0, . . . , and Bn and NBn. The write circuit 8 controls the column-control signal lines WC0-WCn.

The column decoder 6, the write circuit 8, the read circuit 9, and the memory cells 20A, 20B, . . . shown in FIG. 1 are only those which relate to a one-bit input data signal DI0. The semiconductor memory of FIG. 1 receives input data signals DI0, DI1, . . . , and DIa (where "a" is a natural number) each representing a single bit of multi-bit input data. In fact, the semiconductor memory of FIG. 1 is configured in a horizontally repeating pattern, each unit including similar circuits to the column decoder 6, the write circuit 8, the read circuit 9, and the memory cells 20A, 20B, . . . . For simplicity of explanation, the description below will focus on the portion relating to the input data signal DI0.

The controller 2 outputs signals for controlling the row decoder 4, the column decoder 6, the write circuit 8, and the read circuit 9 to the respective components based on a clock CLK, on a chip select signal CE, on a write enable signal WE, and on an address AD. During a write operation, the write circuit 8 generates a signal based on the input data signal DI0, and the column decoder 6 outputs the generated signal to the bit lines Bj and NBj (j=0−n) corresponding to the memory cell to be written into (hereinafter referred to as "write-target memory cell") among the memory cells 20A, 20B, . . . . The write-target memory cell stores the data on the bit lines Bj and NBj.

In a read operation, the column decoder 6 precharges the bit lines Bj and NBj. The memory cell to be read (hereinafter referred to as "read-target memory cell") among the memory cells 20A, 20B, . . . outputs the stored data to the corresponding bit lines Bj and NBj. The read circuit 9 outputs the value read from the memory cell as an output data signal DO0.

Figures 2, 3:
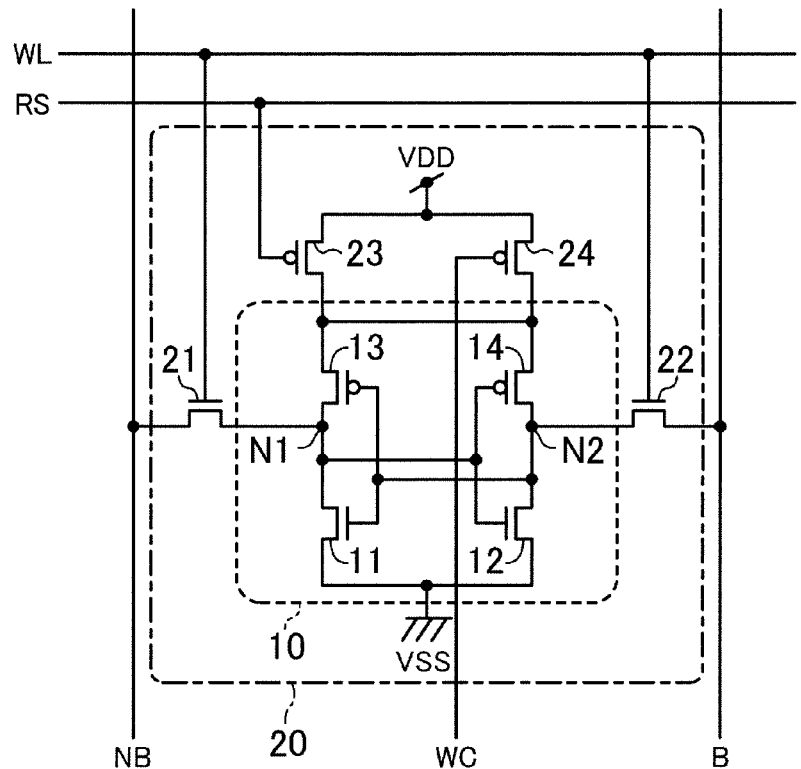
FIG. 2 is a circuit diagram illustrating an example configuration of one of the memory cells of FIG. 1.
FIG. 3 is a diagram illustrating an example of states of the switches in the memory cell of FIG. 2.

FIG. 2 is a circuit diagram illustrating an example configuration of one of the memory cells of FIG. 1. In FIG. 2, the lines corresponding to the memory cell 20 of FIG. 2, of the various lines shown in FIG. 1, are denoted by a word line WL, a row-control signal line RS, bit lines B and NB, and a column-control signal line WC. The memory cell 20 of FIG. 2 is a single-port memory cell, and includes a latch 10, access transistors 21 and 22, and switches 23 and 24. The access transistors 21 and 22 are, for example, n-channel metal oxide semiconductor (NMOS) transistors. The switches 23 and 24 are, for example, p-channel metal oxide semiconductor (PMOS) transistors.

The latch 10 includes drive transistors 11 and 12 and load transistors 13 and 14. The drive transistors 11 and 12 are NMOS transistors, and the load transistors 13 and 14 are PMOS transistors. The drive transistor 11 and the load transistor 13 form a first inverter; the drive transistor 12 and the load transistor 14 form a second inverter. The output node N1 of the first inverter is coupled to the input node of the second inverter; the output node N2 of the second inverter is coupled to the input node of the first inverter. The latch 10 has a capability to hold one bit of data.

The switches 23 and 24 are coupled in parallel to each other between a power source having a potential VDD and the latch 10. The switches 23 and 24 control the supply current to the latch 10. The switch 23 operates based on a signal on the row-control signal line RS; the switch 24 operates based on a signal on the column-control signal line WC. The other memory cells are similarly configured.

Figures 4, 5:
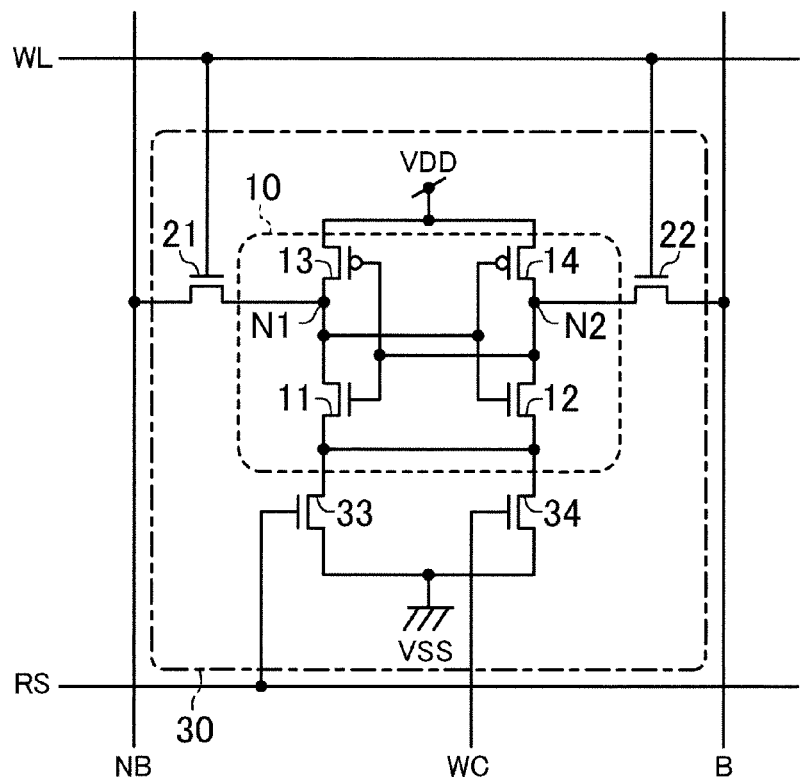
FIG. 4 is a diagram illustrating another example of states of the switches in the memory cell of FIG. 2.
FIG. 5 is a circuit diagram illustrating a configuration of a variation of the memory cell of FIG. 2.

FIG. 3 is a diagram illustrating an example of states of the switches in the memory cell 20 of FIG. 2. FIG. 4 is a diagram illustrating another example of states of the switches in the memory cell 20 of FIG. 2. The information of FIG. 3 applies to a situation in which the switch 23, controlled by the row-control signal line RS, is turned off only during write operations; on the contrary, the information of FIG. 4 applies to a situation in which the switch 23 is turned off also during read operations.

The operation of the semiconductor memory of FIG. 1 will now be described. When a memory access operation is not performed, the row-control signal line RS and the column-control signal line WC are both in a low logic state ("L"). In this condition, the two switches 23 and 24 are both in an On state.

A write operation to the memory cell 20A of FIG. 1 will be described. Specifically, the controller 2 controls the row decoder 4 so as to drive to a high logic state ("H") the word line WL0 of the selected row to which the memory cell 20A belongs, thereby turning on the access transistors 21 and 22, and also to drive the row-control signal line RS0 of the selected row to "H." Concurrently, the controller 2 controls the write circuit 8 so as to drive the column-control signal line WC0 which specifies the selected column to which the memory cell 20A belongs, to "H." In this situation, the column-control signal lines WCn etc. of the other columns remain "L." This operation causes both the switches 23 and 24 to become inactive (i.e., be turned off) only in the write-target memory cell 20A.

In each of the other memory cells in the same row as the memory cell 20A, the switch 24 is in an On state. In each of the other memory cells in the same column as the memory cell 20A, the row-control signal line RSm etc. is "L," and thus the switch 23 is in an On state, thereby causing the corresponding word line to be also inactive. Thus, since at least one of the switch 23 or 24 is in an On state, data can be held easily.

In the write-target memory cell 20A, the sources of the load transistors 13 and 14 are not supplied with the power source potential VDD. Therefore, for example, driving the bit line NB of FIG. 2 to "L" allows the output node N1 to be easily driven to "L" even if the load transistor 13 is in an On state. This operation causes the drive transistor 12 to be turned off, and causes the load transistor 14 to be turned on. Although the source of the load transistor 14 is not supplied with the power source potential, the node N2 is driven to a potential close to "H" through the access transistor 22 by the bit line B pre-charged to "H." Therefore, the drive transistor 12 is cut off, thereby facilitating a rise of the potential at the node N2. This process causes the gate-to-source voltage of the drive transistor 11 to increase, and the transistor 11 to be turned on, thereby providing feedback to reduce the potential at the node N1. Thus, a write operation to the memory cell 20A can be easily performed. Similarly, driving the bit line B to "L" allows the output node N2 to be easily driven to "L."

Moreover, returning either of the row-control signal line RS or the column-control signal line WC to "L" before driving the word line WL to "L" activates the operation of the inverter which is supplied with the potential "L." This process improves write characteristics, thereby improving the characteristics at a low voltage. Thus, a write operation to the write-target memory cell 20A can be easily performed without adversely affecting other memory cells.

A read operation from the memory cell 20A of FIG. 1 will be described. In this read operation, the controller 2 selects the row and the column to which the memory cell 20A belongs. Specifically, the controller 2 controls the row decoder 4 so as to drive the word line WL0 of the row to which the memory cell 20A belongs, to "H," thereby turning on the access transistors 21 and 22.

In the read operation, all the column-control signal lines are held "L." The row-control signal line RS0 may be driven to "H" or held "L." Holding the row-control signal line RS0 at "L" (FIG. 3) allows the charge/discharge current relating to the operation of the row-control signal line RS0 to be reduced. Similarly to the memory cells in the row selected for a write operation (the target memory cell and the other memory cells in the selected row), the row-control signal line RS0 may be driven to "H" (FIG. 4). The latter alternative is advantageous in that the logic configuration can be simplified.

In either case, either of the switch 23 or 24 is in an On state, and thus if the memory cells are designed to have appropriate characteristics, the memory cells in the same row coupled to the same word line as the read-target memory cell are also prevented from losing data stored therein when the word line potential goes "H." In other words, sufficient static noise margin is ensured. Static noise margin represents the data retention characteristics of a memory cell when the corresponding word line is activated. Moreover, leakage current to the substrate causes no loss of data stored.

FIG. 5 is a circuit diagram illustrating a configuration of a variation of the memory cell of FIG. 2. The memory cell of FIG. 5 is configured similarly to the memory cell of FIG. 2 except that the memory cell of FIG. 5 includes switches 33 and 34 instead of the switches 23 and 24. The switches 33 and 34 are coupled in parallel to each other between a power source having a potential VSS and the latch 10. The switches 33 and 34 control the supply current to the latch 10. The semiconductor memory of FIG. 1 may include the memory cells of FIG. 5 instead of the memory cells 20A, 20B, . . . . In such a case, the potentials of the row-control signal lines RS0 etc. are logically inverted with respect to those used for the memory cells 20A etc.

In the memory cell of FIG. 5, a current flows into the node whose potential should be lowered during a write operation, from the load transistor 13 or 14. However, the source potentials of the drive transistors 11 and 12 become higher than VSS, and accordingly the inverter is likely to determine that the potential of the node is "L," thereby facilitating write operations.

In general, a PMOS transistor exhibits smaller random variation than an NMOS transistor. Thus, the memory cell of FIG. 2, which uses PMOS transistors as the switches, often has better characteristics than those of the memory cell of FIG. 5, which uses NMOS transistors as the switches.

Figure 6:
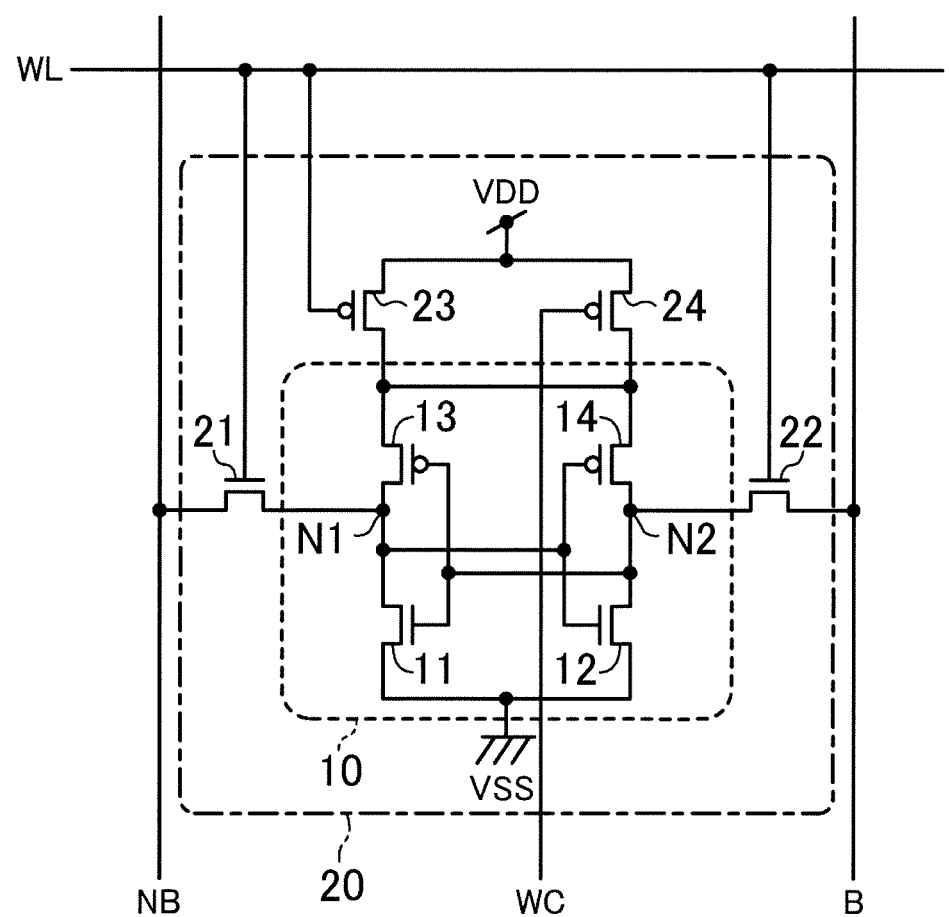
FIG. 6 is a circuit diagram illustrating a configuration of another variation of the memory cell of FIG. 2.

FIG. 6 is a circuit diagram illustrating a configuration of another variation of the memory cell of FIG. 2. In the memory cell of FIG. 6, the gate of the switch 23 is coupled not with the row-control signal line RS, but with the word line WL. If PMOS transistors are used as the switches, the word line WL and the row-control signal line RS of FIG. 2 are both driven to "H" when activated. Using this characteristic, the memory cell of FIG. 6 is configured not to use the row-control signal line RS.

In a similar manner, in each example of other memory cells having the row-control signal line RS described herein, the gate of the switch 23 may be coupled not with the row-control signal line RS, but with the word line WL etc., and the memory cell may omit the row-control signal line RS. Conversely, in each example of other memory cells not having the row-control signal line RS described herein, the memory cell may be configured to include the row-control signal line RS, and the gate of the switch 23 may be coupled not with the word line WL etc., but with the row-control signal line RS.

Figure 7:
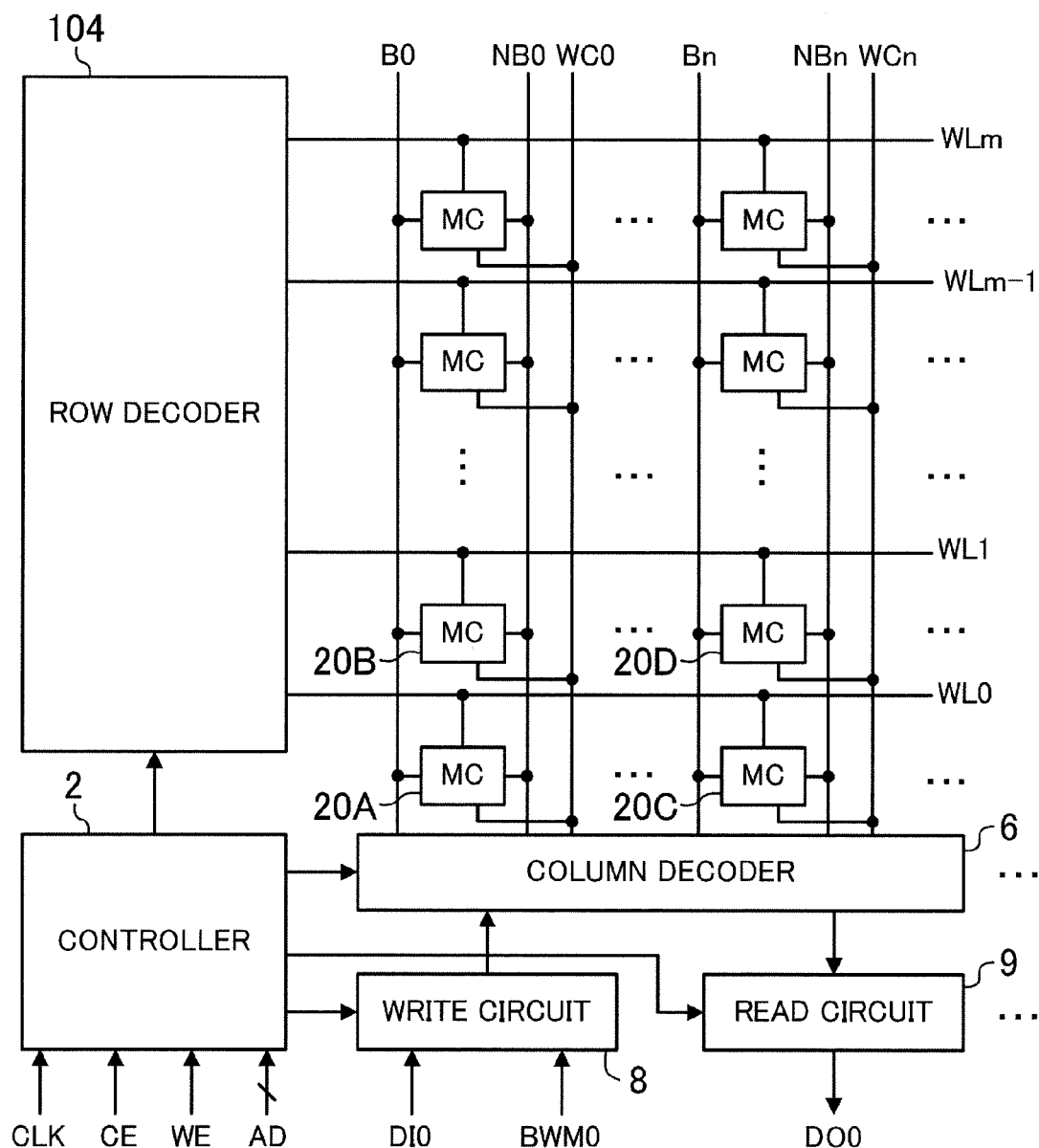
FIG. 7 is a block diagram illustrating an example configuration of a semiconductor memory which uses the memory cells of FIG. 6.

FIG. 7 is a block diagram illustrating an example configuration of a semiconductor memory which uses the memory cells of FIG. 6. The semiconductor memory of FIG. 7 is similar to the semiconductor memory of FIG. 1 except that the semiconductor memory of FIG. 7 includes the memory cells of FIG. 6 instead of the memory cells of FIG. 2, and the row decoder 104 instead of the row decoder 4, and does not include the row-control signal lines RS0-RSm. The row decoder 104 is similar to the row decoder 4 except that the row decoder 104 does not drive the row-control signal lines RS0-RSm.

The semiconductor memory of FIG. 7 requires no row-control signal lines, thereby allowing the number of row-wise interconnects to be decreased, and thus allowing an easy interconnect layout. This feature reduces the density of the interconnect pattern, thereby facilitating an increase in the pattern size and/or the pattern spacing. In addition, improved processability can increase production yield and/or reduce the area of the memory cells. The semiconductor memory of FIG. 7 can also easily reduce the word line capacitance by increasing the pattern spacing, and/or reduce the word line resistance by increasing the word line width.

Next, improvement in static noise margin characteristic will be described. In the memory cell of FIG. 2, operations of the switches 23 and 24 interrupt the current supplies from the load transistors to the output nodes during a write operation, thereby improving the write characteristics. By increasing the static noise margin using the margin generated in this manner, a well-balanced memory cell can be designed. Since the operating voltage range of a memory cell depends on the worst one of the various characteristics, a good balance of various characteristics of a memory cell is important in the design phase.

One technique is to slightly reduce the potential of the word line WL in an active state by the row decoder 104 to, for example, VDD−α. This technique reduces the conductances of the access transistors 21 and 22, and thus the lower one of the potentials of the output nodes N1 and N2 is less likely to be increased due to the precharge potential ("H") of the bit lines B and NB, thereby improving the noise margin characteristic.

In the memory cell of FIG. 2, the word line WL and the row-control signal line RS, which controls the switch 23, are independent of each other, and only the word line potential is driven to VDD−α. Thus, by providing the potential VDD to the gate of the switch 23, the ratio between the resistance values of the switch 23 in an On state and in an Off state is increased. In the memory cell of FIG. 6, where the word line WL controls the switch 23, a slight degradation in cut-off characteristics of the switch 23 poses no problems.

The value of α is less than or equal to about the threshold Vt of the access transistors. Therefore, even if the operation of the switch 23, having a gate-to-source voltage near the threshold and nearly in an Off state, conflicts with the operations of the access transistors 21 and 22, having a gate-to-source voltage VDD-Vt which is greatly higher than the threshold, the effects of the operations of the access transistors 21 and 22 easily exceed that of the switch 23, thereby allowing a write operation to be performed. The reason for setting the value of α to a value less than or equal to about the threshold Vt of the access transistors is that a higher value of α prevents many access transistors from being turned on. The thresholds of the switches 23 and 24 and of the access transistors 21 and 22 may be adjusted by changing the concentration of implanted ions. Thus, this method allows further optimization.

Figure 8:
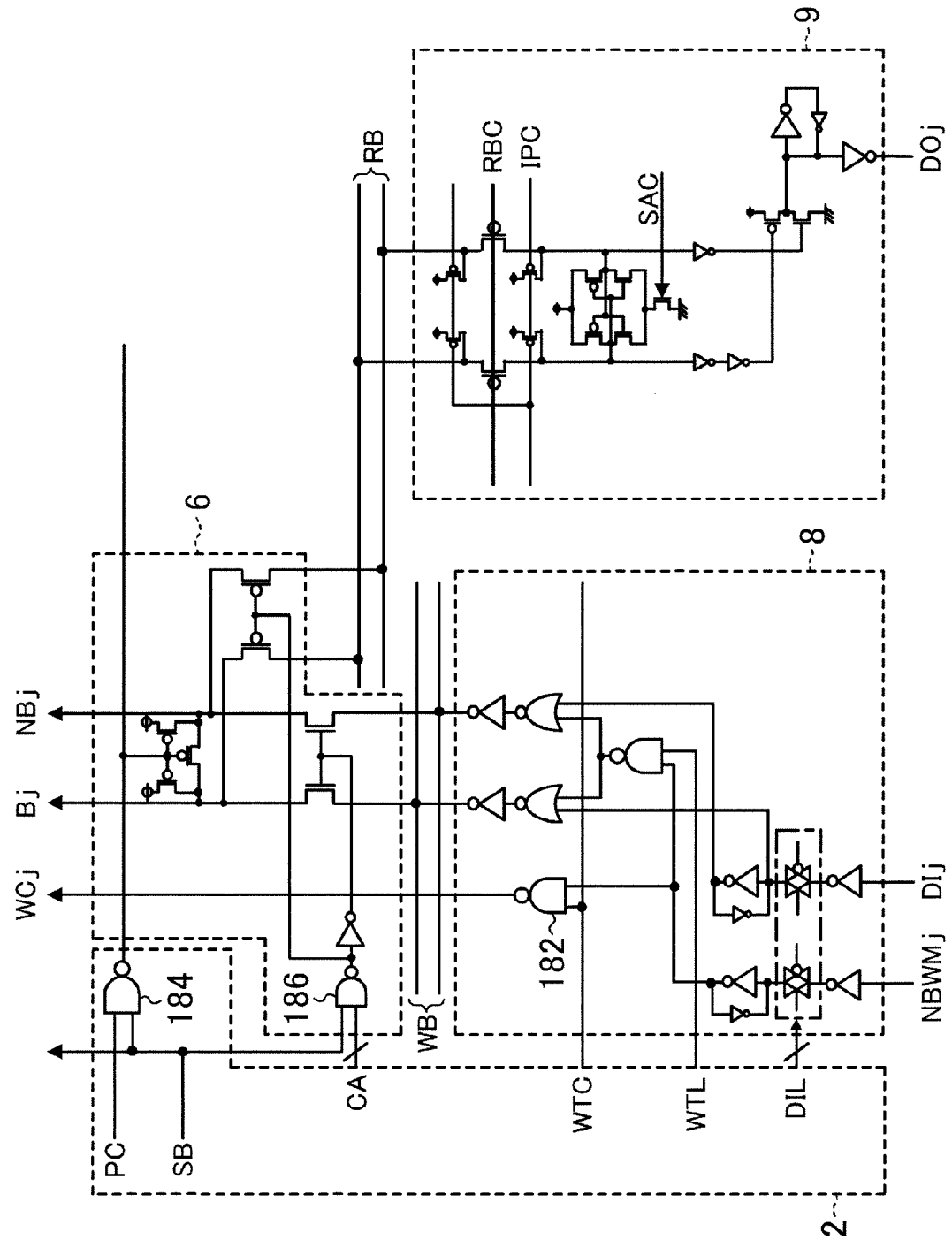
FIG. 8 is a circuit diagram illustrating a part of a circuit in relation to input and output signals included in the semiconductor memory of FIG. 1.

FIG. 8 is a circuit diagram illustrating a part of a circuit in relation to input and output signals included in the semiconductor memory of FIG. 1. Referring to FIG. 8, the column decoder 6, the write circuit 8, and the read circuit 9 will be described in more detail. Here, only a portion relating to the one-bit input data signal DI0 is illustrated. The other bits are also similarly processed. For purposes of illustration, a write mask signal NBWM0 is shown, which is a logically-inverted signal of a write mask signal BWM0.

The write circuit 8 receives a write control signal WTC, a write clock WTL, and a DI latch signal DIL from the controller 2, and the write mask signal NBWM0 and the input data signal DI0 from outside the semiconductor memory of FIG. 1. The write mask signal NBWM0 indicates whether or not to store the corresponding bit. If the write mask signal NBWM0 is inactive (i.e., "H"), the write circuit 8 outputs signals dependent on the input data signal DI0 to write buses WB. If the write mask signal NBWM0 is active (i.e., "L"), the write circuit 8 outputs the both signals at the "H" level to the write buses WB.

During a write operation, the column decoder 6 outputs the signals which are output to the write buses WB, to the bit lines Bj and NBj of the column corresponding to a column address signal CA generated by the controller 2 based on the address AD. The write-target memory cell stores the data based on the bit lines Bj and NBj. However, if the write mask signal BWM0 is active, the bit lines Bj and NBj are both "H," and accordingly the data in the memory cell is not rewritten. The write circuit 8 includes a logic gate 182; and if the write mask signal NBWM0 is active, the logic gate 182 maintains the column-control signal line WCj at "L."

That is, when the write mask signal NBWM0 is active, the data in the memory cell for the bit corresponding to this signal is not rewritten, but the data in the memory cell is held. This also applies to the other bits of the input data to the semiconductor memory of FIG. 1; that is, when a write mask signal is active, the data in the memory cell for the bit corresponding to this signal is not rewritten. In this manner, the semiconductor memory of FIG. 1 has a write mask function not to rewrite data for specified bits.

A case in which the input data has two or more bits, and there are two or more write-target memory cells in a same row will be described below referring to FIG. 2 or FIG. 6. In the memory cell selected by a write mask signal, even if the switch 23 is turned off in response to the state of the word line WL or of the row-control signal line RS, the column-control signal line WC is maintained at "L," thereby causing the switch 24 to be maintained in an On state.

If the switches 23 and 24 are both turned off, the latch 10 is no longer supplied with a current. Accordingly, a memory cell to which no data is written due to the "H" level on the bit lines B and NB may lose the data held therein because of junction leakage current while the corresponding word line is active. The circuit of FIG. 8 prevents such a problem.

During a read operation, the column decoder 6 of FIG. 8 precharges the bit lines Bj and NBj (j=0−n) based on a signal generated by the controller 2 based on a precharge signal PC and a standby signal SB. The read-target memory cell among the memory cells 20A, 20B, . . . outputs the stored value to the bit lines Bj and NBj corresponding thereto. The read circuit 9 writes the value read from the memory cell to read buses RB, amplifies the signals on the read buses RB by a sense amplifier, and outputs the amplified signals as the output data signal DO0. The read circuit 9 is controlled by a read bus connection signal RBC, an internal bus precharge control signal IPC, and a sense amplifier activation signal SAC.

In the semiconductor memory of FIG. 1 or FIG. 7, the write circuit 8 may drive to "H" the column-control signal lines WCj with respect to two or more columns of the memory cells 20 in the memory cell array. In such an operation, the switch 24 is turned off. Since this situation limits the current paths as compared with when the switches 23 and 24 are both turned on, leakage current flowing from the power source having the potential VDD to the power source having the potential VSS (ground) via the latch 10 can be reduced. In this case, since the latch 10 is supplied with a current, data in the memory cell is held also during a standby period. The sizes of the transistors included in the switches 23 and 24 may be determined based on desired cell characteristics and/or the magnitude of leakage current.

If a memory cell in the memory cell array does not need to hold data, not only may the write circuit 8 drive the column-control signal line WCj to "H" as described above, but also the row decoder 4 of the semiconductor memory of FIG. 1 may drive all of the row-control signal lines RSi to "H," or the row decoder 104 of the semiconductor memory of FIG. 7 may drive all of the word lines WLi to "H." This operation causes both the switches 23 and 24 to be turned off. Accordingly, the current path from the power source having the potential VDD to ground via the latch 10 is disconnected, thereby allowing leakage current to be significantly reduced.

In general, the bit lines Bi and NBi are precharged to "H." Therefore, when the row-control signal line RSi or the word line WLi is also driven to "H," a current may flow from the precharge circuit to ground via the memory cell through the access transistors 21 and 22 in an On state. In addition, when the bit lines Bi and NBi are driven to an intermediate potential between "H" and "L," a through-current flows through the inverters etc. of the write circuit 8 or of the read circuit 9 which receive the potentials of these bit lines.

Thus, as shown in FIG. 8, the controller 2 includes a logic gate 184, and each of the column decoders 6 of all the columns of the memory cells 20 includes a logic gate 186. The controller 2 generates a standby signal SB, which goes "L" when the memory cell in the memory cell array does not need to hold data, and otherwise goes "H." When the standby signal SB goes "L," the logic gate 184 outputs a signal so that the precharge circuit of that column decoder 6 will not operate, and the logic gate 186 turns off the column switch in that column decoder 6 so that neither a write operation from the write circuit 8 to the bit lines Bj and NBj nor a read operation from the bit lines Bj and NBj to the read circuit 9 will be performed. This operation prevents a current through the memory cell and a through-current from flowing.

Figure 9:
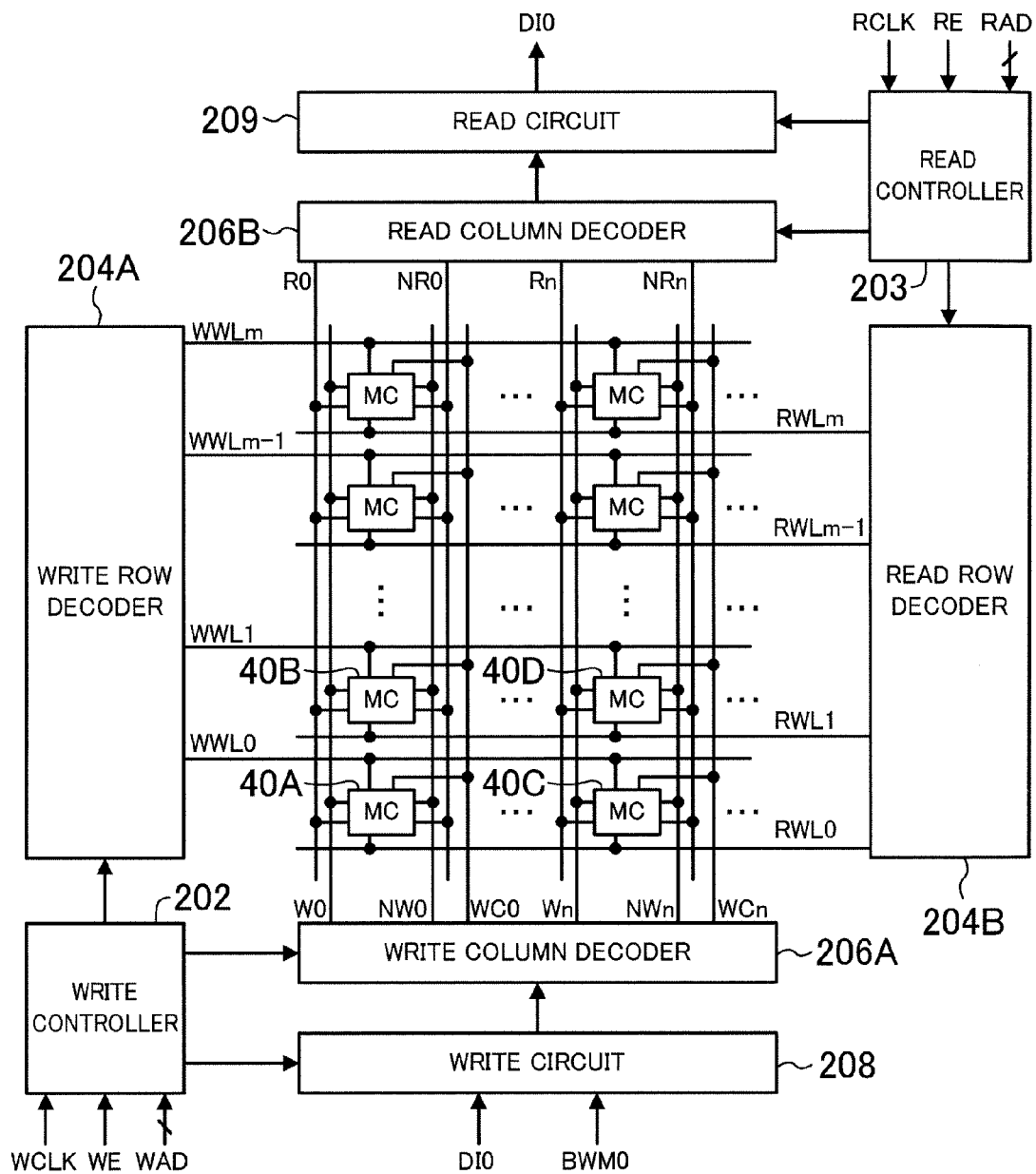
FIG. 9 is a block diagram illustrating another example configuration of the semiconductor memory according to the present invention.

FIG. 9 is a block diagram illustrating another example configuration of the semiconductor memory according to the present invention. The semiconductor memory of FIG. 9 includes a write controller 202, a read controller 203, a write row decoder 204A, a read row decoder 204B, a write column decoder 206A, a read column decoder 206B, a write circuit 208, a read circuit 209, m×n (where m and n are each an integer greater than or equal to 2) memory cells 40A, 40B, 40C, 40D, . . . arranged in a matrix format, write word lines WWL0, WWL1, . . . , WWLm−1, and WWLm, read word lines RWL0, RWL1, . . . , RWLm−1, and RWLm, write bit lines W0, NW0, . . . , Wn, and NWn, read bit lines R0, NR0, . . . , Rn, and NRn, and column-control signal lines WC0, . . . , and WCn. The bit lines Wi and NWi constitute a write bit line pair, and the bit lines Ri and NRi constitute a read bit line pair.

The write word lines WWL0-WWLm each correspond to a row of the memory cells 40A, 40B, . . . , and the read word lines RWL0-RWLm each correspond to a row of the memory cells 40A, 40B, . . . . The bit line pairs of FIG. 9 each correspond to a column of the memory cells 40A, 40B, . . . , and the read bit line pairs each correspond to a column of the memory cells 40A, 40B, . . . . The column-control signal lines WC0-WCn each correspond to a column of the memory cells 40A, 40B, . . . . The row decoder 204 controls the word lines WL0-WLm and RWL0-RWLm; the write column decoder 206A controls the write bit line pairs; the read column decoder 206B controls the read bit line pairs; and the write circuit 208 controls the column-control signal lines WC0-WCn.

The write column decoder 206A, the read column decoder 206B, the write circuit 208, the read circuit 209, and the memory cells 40A, 40B, . . . shown in FIG. 9 are only those which relate to the one-bit input data signal DI0. The semiconductor memory of FIG. 9 receives one-bit input data signals DI0-DIa. In fact, the semiconductor memory of FIG. 9 is configured in a horizontally repeating pattern, each unit including similar circuits to the write column decoder 206A, the read column decoder 206B, the write circuit 208, the read circuit 209, and the memory cells 40A, 40B, . . . .

Figure 10:
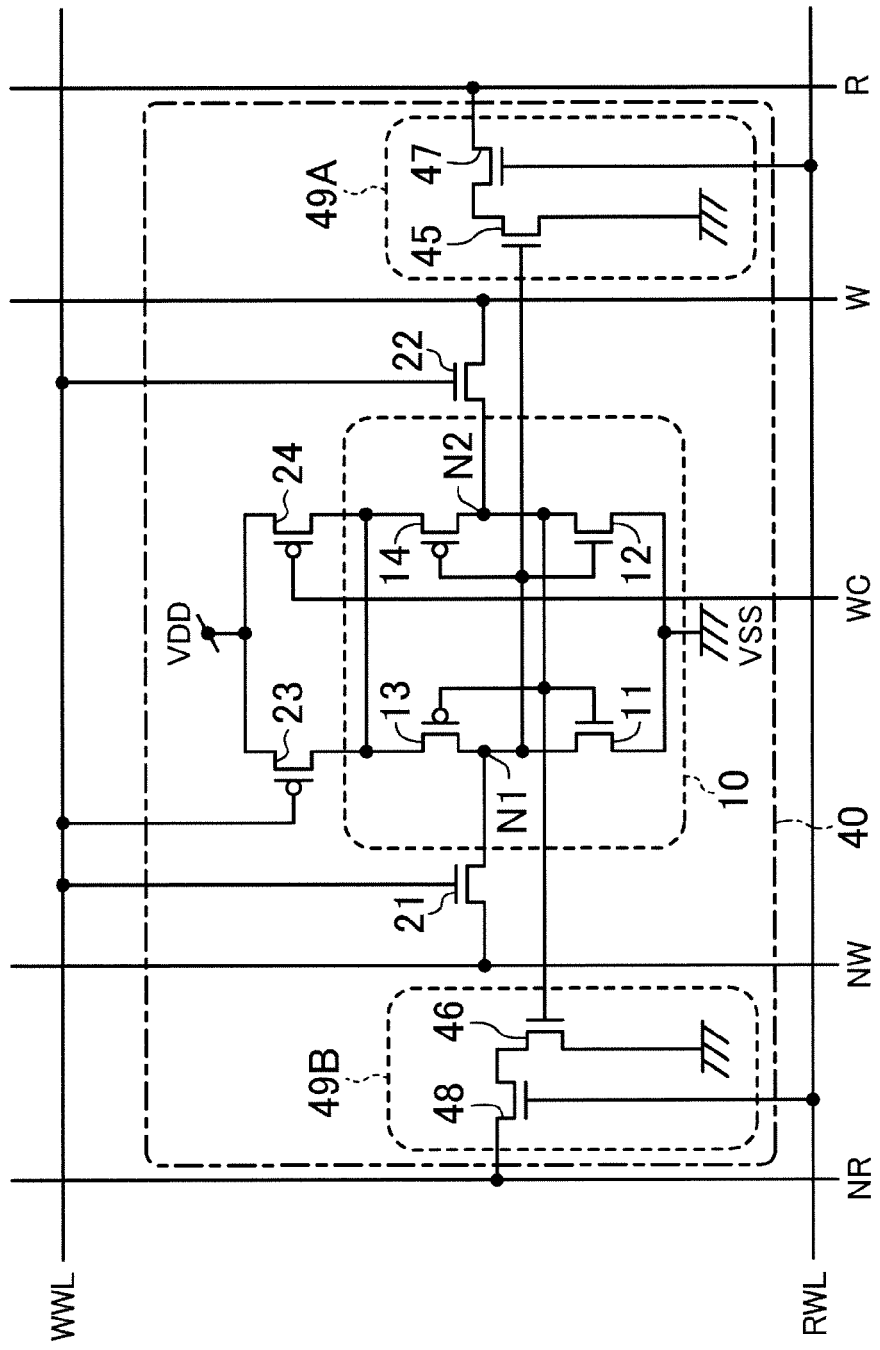
FIG. 10 is a circuit diagram illustrating an example configuration of one of the memory cells of FIG. 9.

FIG. 10 is a circuit diagram illustrating an example configuration of one of the memory cells of FIG. 9. In FIG. 10, the lines corresponding to the memory cell 40 of FIG. 10, of the various lines shown in FIG. 9, are denoted by a write word line WWL, a read word line RWL, write bit lines W and NW, read bit lines R and NR, and a column-control signal line WC. The memory cell 40 of FIG. 10 includes the latch 10, the access transistors 21 and 22, the switches 23 and 24, and access circuits 49A and 49B.

The access circuit 49A includes a read-port drive transistor 45 and a read access transistor 47; the access circuit 49B includes a read-port drive transistor 46 and a read access transistor 48. The access transistors 21 and 22 form a write port, and the access circuits 49A and 49B form a read port. The memory cell 40 of FIG. 10 is a dual-port memory cell, and thus a read access operation and a write access operation can be concurrently performed.

FIG. 11 is a diagram illustrating an example of states of the switches in the memory cell 40 of FIG. 10. The field "W cell" represents a write-target memory cell, and the field "R cell" represents a read-target memory cell.

First, a simple read operation for the memory cell 40A of FIG. 9 will be described. It is assumed that no write accesses are concurrently performed during this read operation. The read column decoder 206B precharges the bit lines R0, NR0, . . . , Rn, and NRn to "H." The read controller 203 controls the read row decoder 204B so as to drive to "H" the read word line RWL0 of the selected row to which the memory cell 40A belongs, thereby turning on the transistors 47 and 48 of the memory cell 40A.

Since the transistor 45 or 46 which is coupled to the node N1 or N2 whichever is at the "H" level is in an On state, the transistor in an On state drives the potential of the bit line R or NR down to "L." The potentials of the nodes N1 and N2 are respectively supplied to the gates of the transistors 45 and 46 as shown in FIG. 10, and thus a read operation does not change the potentials of the nodes N1 and N2, thereby causing the content stored in the memory cell 40A to be retained. In this case, no problems arise with static noise margin.

A simple write operation to the memory cell 40A of FIG. 9 will be described below. It is assumed that no read accesses are concurrently performed during this write operation. Specifically, the write controller 202 controls the write row decoder 204A so as to drive to "H" the write word line WWL0 of the selected row to which the memory cell 40A belongs, thereby turning on the access transistors 21 and 22. At the same time, the write controller 202 also controls the write circuit 208 so as to drive to "H" the column-control signal line WC0 which specifies the selected column to which the memory cell 40A belongs. In this situation, the column-control signal lines WCn etc. of the other columns remain "L." This operation causes both the switches 23 and 24 to be turned off only in the write-target memory cell 40A. Thus, similarly to the case of the memory cell 20A of FIG. 1, the write operation from the bit lines to the memory cell 40A can be easily performed.

A concurrent access operation to a memory cell in a same row (selected row) or in a same column (selected column) as that of the write-target memory cell 40A will be described. First of all, there are no problems with interference from the read port to the write-target memory cell 40A. This conclusion is supported by the fact that the switches 23 and 24 are not controlled from the read port side, but are controlled only from the write port side, and that activation of the read word line RWL0 causes no interference from the bit lines R and NR to the interior of the memory cell 40A because the output nodes N1 and N2 are coupled to the read-port drive transistors 45 and 46.

Next, a read operation to the memory cell 40C in the same row as the write-target memory cell 40A will be described. Since the write word line WWL0 is active, the switch 23 of the memory cell 40A is in an Off state. The column-control signal line WC0 of the column of the memory cell 40A remains "H," while the column-control signal line WCn of the column of the read-target memory cell 40C is "L." The other write bit lines other than the write bit lines W0 and NW0 do not go "L." Therefore, the gate potentials of the read-port drive transistors 45 and 46 are not disturbed, but are maintained at constant potentials. Thus, a read operation does not reduce the amount of current flowing from the bit lines to the memory cell, thereby achieving a high-speed read operation similarly to a simple read operation.

Next, a read operation to the memory cell 40B in the same column as the write-target memory cell 40A will be described. Since the column-control signal line WC0 goes "H," the switch 24 of the memory cell 40B is turned off. On the contrary, since, among the write word lines, only the word line WWL0 is active ("H"), the switch 23 of the memory cell 40B remains in an On state.

Although the potential of the write bit line W0 or NW0 goes "L," the write word line WWL1 corresponding to the read-target memory cell 40B is inactive, thereby causing the access transistors 21 and 22 to be turned off; accordingly, the nodes of the memory cell 40B are not affected. Therefore, the gate potentials of the read-port drive transistors 45 and 46 are not disturbed, but are maintained at the potential VDD or VSS. Thus, a read operation does not reduce the amount of current flowing from the bit lines to the memory cell, thereby achieving a high-speed read operation similarly to a simple read operation.

In each of the memory cells neither in the selected row nor in the selected column, both the switches 23 and 24 are turned on. In each of the memory cells in the standby mode, both the switches 23 and 24 are turned off.

As described above, according to the semiconductor memory of FIG. 9, since there is no need to reduce the latch voltage of the memory cell, a read operation does not reduce the amount of current flowing from the bit lines to the memory cell, and a write operation can also be facilitated. Thus, even if the memory cells are each formed using small-sized transistors having a large variation in characteristics, normal operation can be achieved at a low supply voltage. No reliability problems arise because negative bit lines are not used, and the latch voltage is not excessively increased. Since the switches 23 and 24 of the write-target memory cell are turned off using logic operations, there is no need to generate an intermediate potential, and accordingly no through-currents etc. are generated in such a process. Therefore, the memory can operate with low power consumption. In summary, a low power consumption multi-port memory, suitable for a fine pattern process, small in circuit area, and operable at a low supply voltage, can be achieved.

Figure 12:
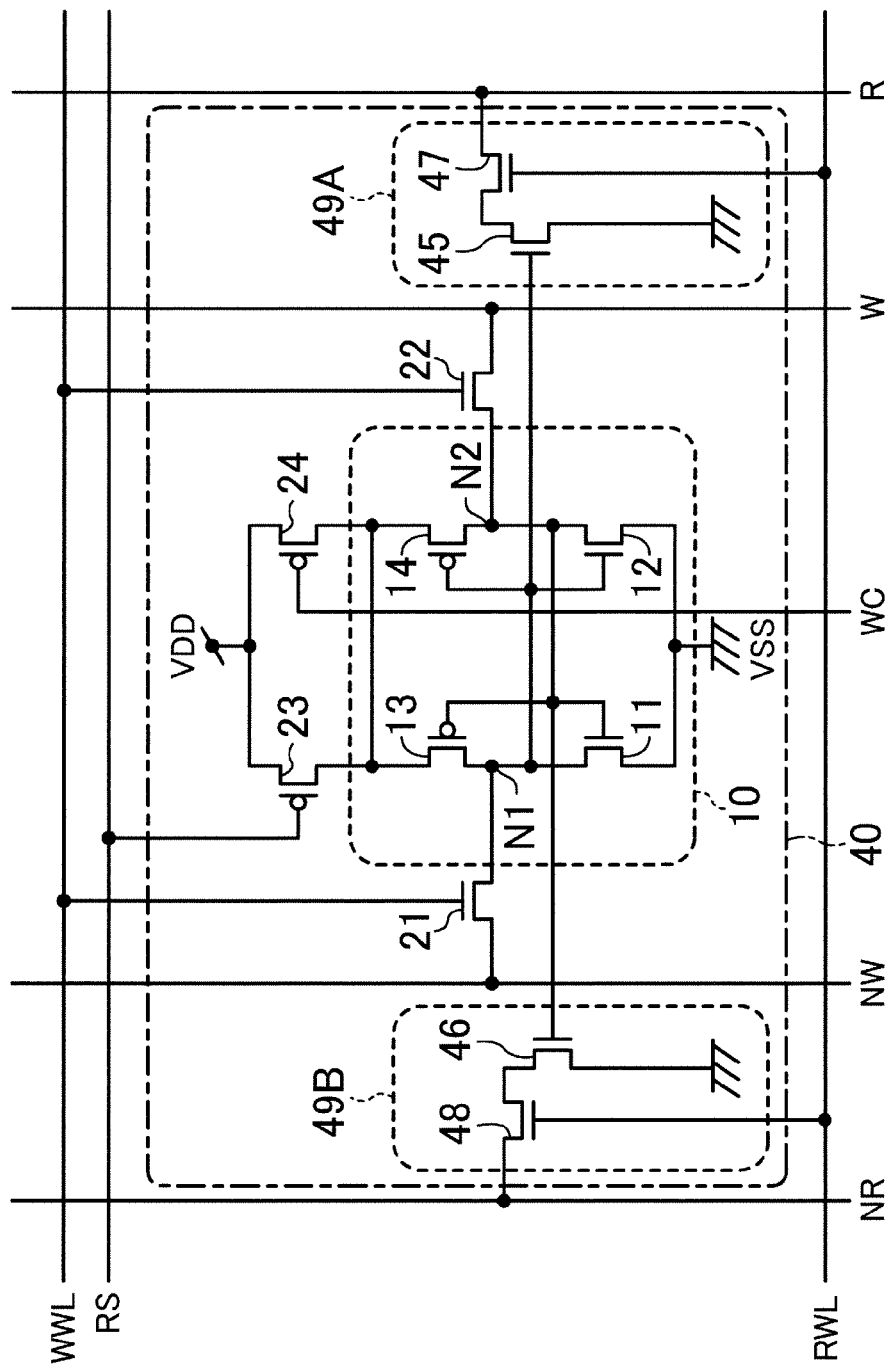
FIG. 12 is a circuit diagram illustrating another example of connection arrangement of the memory cell of FIG. 10.

FIG. 12 is a circuit diagram illustrating another example of connection arrangement of the memory cell of FIG. 10. The memory cell 40 of FIG. 12 has connection arrangement similar to that of the memory cell 40 of FIG. 10 except that the gate of the switch 23 is coupled to the row-control signal line RS. The semiconductor memory of FIG. 9 may further include row-control signal lines each corresponding to a row of the memory cells, and the memory cell 40 may have the connection arrangement shown in FIG. 12. In such a case, the write controller 202 controls the write row decoder 204A so as to drive the row-control signal lines of the respective rows in a similar manner to the write word lines.

Figure 13:
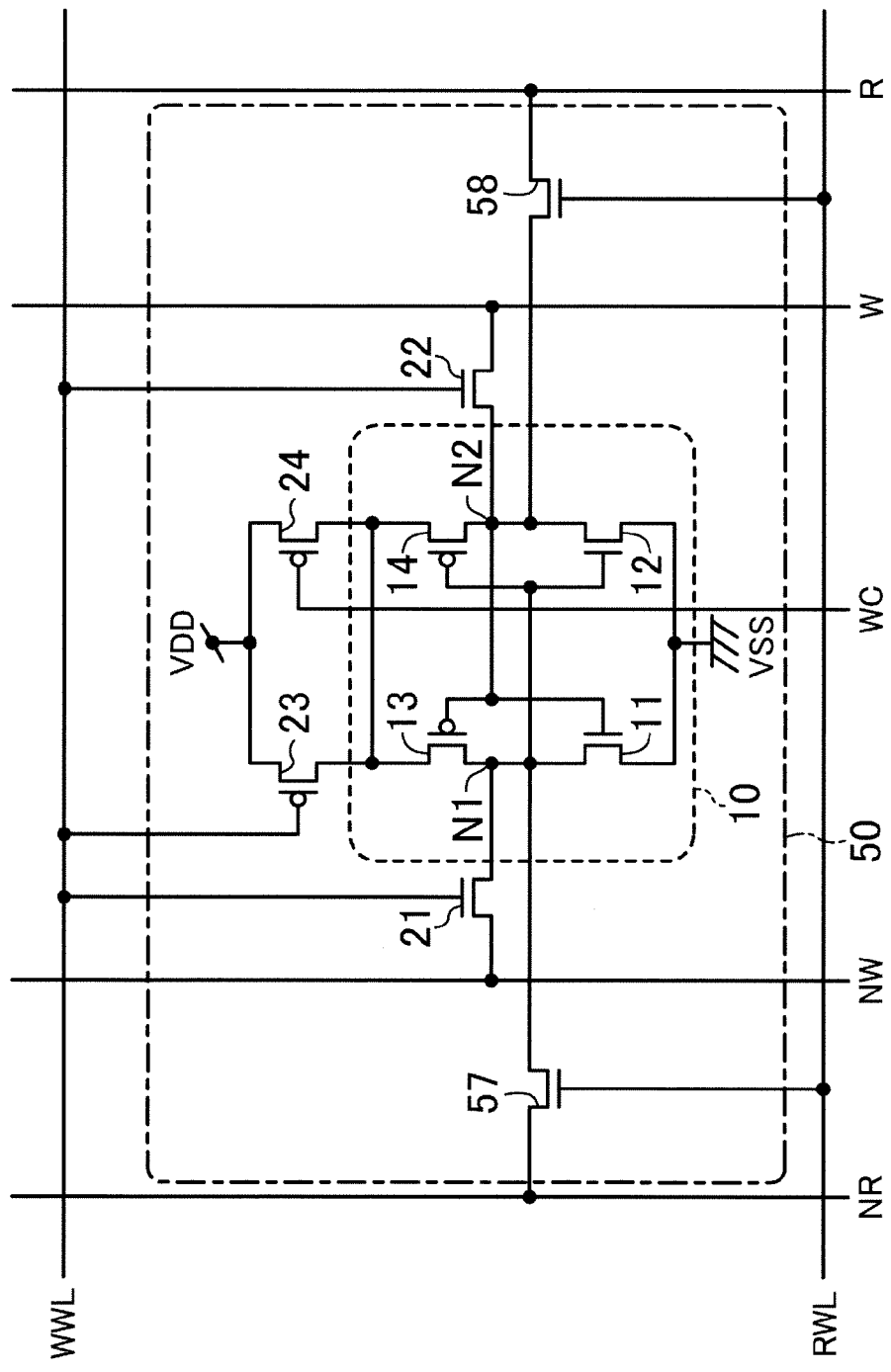
FIG. 13 is a circuit diagram illustrating a configuration of a variation of the memory cell of FIG. 10.

FIG. 13 is a circuit diagram illustrating a configuration of a variation of the memory cell of FIG. 10. The memory cell 50 of FIG. 13 is configured similarly to the memory cell of FIG. 10 except that the memory cell 50 of FIG. 13 includes read access transistors 57 and 58 instead of the access circuits 49A and 49B, respectively. The read access transistors 57 and 58 form a read port. The semiconductor memory of FIG. 9 may include the memory cells 50 of FIG. 13 instead of the memory cells 40 of FIG. 10.

Concurrent performance, in such a configuration, of a write operation to the write-target memory cell, and a read operation to a memory cell in the same row as the write-target memory cell will be described. Turning off the switches 23 and 24 of the write-target memory cell facilitates the write operation to this memory cell. In this operation, the electrical charge on the read bit line R or NR needs to be discharged to ground through the access transistor 57 or 58. In spite of this, the write operation is not interfered with, but the write operation can be easily performed.

Concurrent performance of a write operation to the write-target memory cell, and a read operation to a memory cell in the same column as the write-target memory cell will be described. Since the read word line RWL of the write-target memory cell is "L," and the read access transistors 57 and 58 are cut off, no problems arise with a write operation.

The read-target memory cell, to which a read operation is performed concurrently with a write operation to the write-target memory cell, will be described. The switches 23 and 24 are both turned off only in the write-target memory cell, while at least one of the switch 23 or 24 is turned on in the read-target memory cell. Therefore, the latch 10 is supplied with the supply voltage VDD, thereby posing no problems to the read operation.

Figure 14:
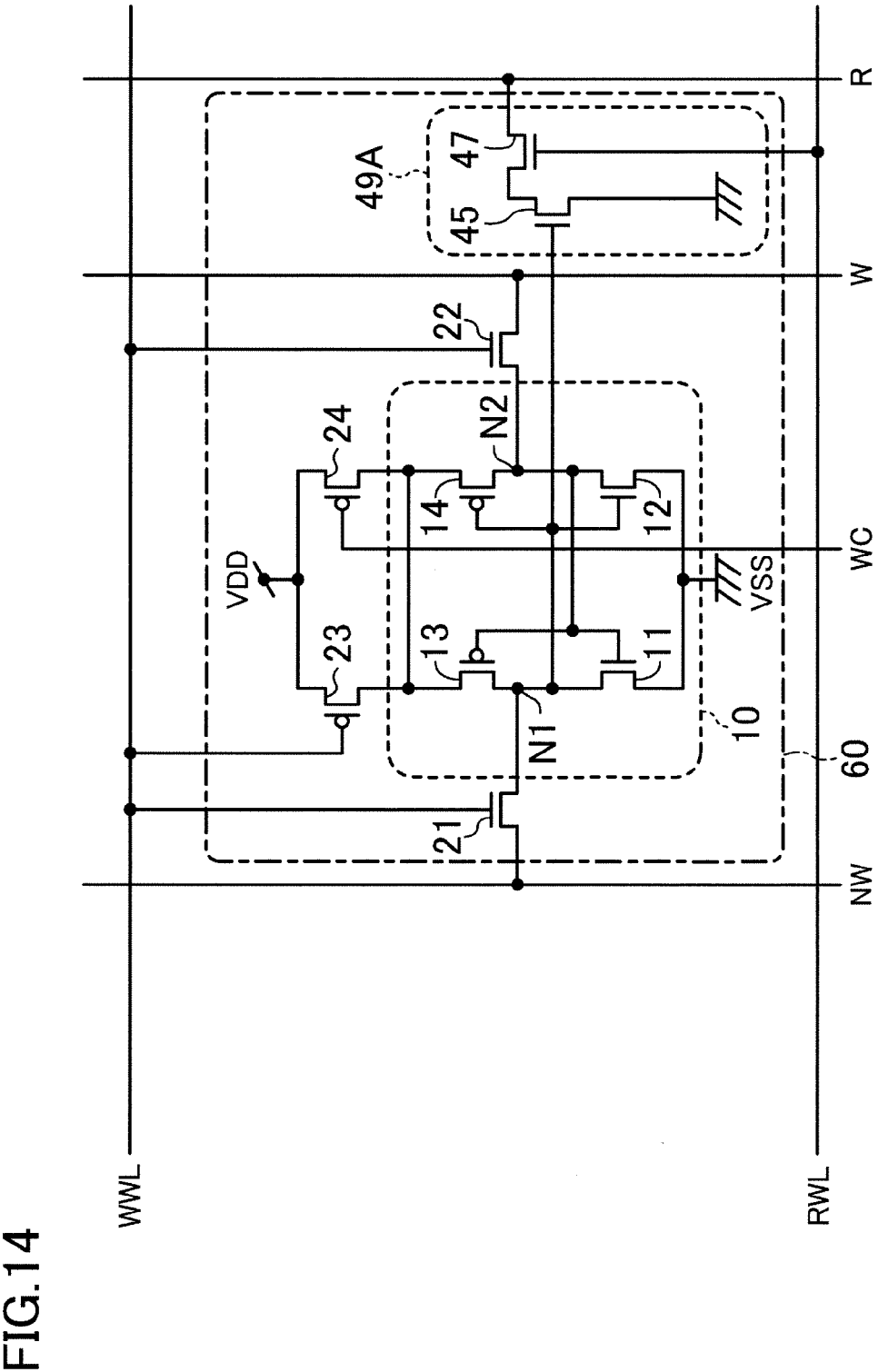
FIG. 14 is a circuit diagram illustrating a configuration of another variation of the memory cell of FIG. 10.

FIG. 14 is a circuit diagram illustrating a configuration of another variation of the memory cell of FIG. 10. The memory cell 60 of FIG. 14 is configured similarly to the memory cell of FIG. 10 except that the memory cell 60 of FIG. 14 does not include the access circuit 49B. The semiconductor memory of FIG. 9 may include the memory cells 60 of FIG. 14 instead of the memory cells 40 of FIG. 10. In such a case, the read bit lines NRi are no longer required. Usage of the memory cells 60 of FIG. 14 and usage of hierarchical bit lines only for the read bit lines enables very high-speed read access. Hierarchical bit lines may also be applied to the write bit lines.

Figure 15:
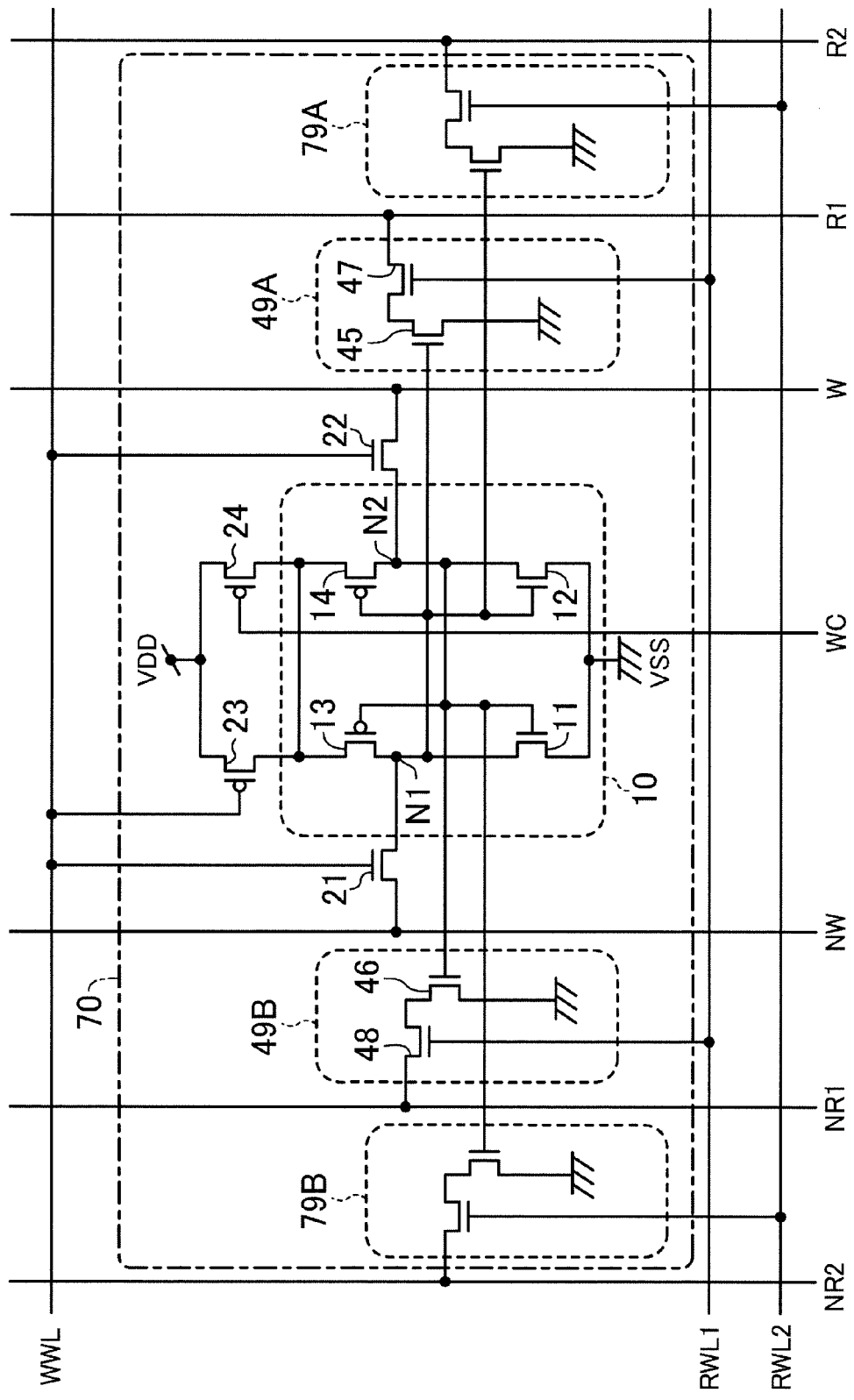
FIG. 15 is a circuit diagram illustrating an example configuration of a triple-port memory cell.

FIG. 15 is a circuit diagram illustrating an example configuration of a triple-port memory cell. The memory cell 70 of FIG. 15 is configured similarly to the memory cell of FIG. 10 except that the memory cell 70 of FIG. 15 further includes access circuits 79A and 79B similar to the access circuits 49A and 49B. The access circuits 79A and 79B form a read port. The semiconductor memory of FIG. 9 may include the memory cells 70 of FIG. 15 instead of the memory cells 40 of FIG. 10. In such a case, the semiconductor memory of FIG. 9 further includes read bit lines R2 and NR2 each corresponding to a column of the memory cells, and the read controller 203 controls the read column decoder 206B so as to read data from the read bit lines R2 and NR2 of each column.

In both of the read port including the access circuits 49A and 49B, and the read port including the access circuits 79A and 79B, the nodes N1 and N2 are coupled with the gates of the transistors. Thus, a read operation from either port creates no static noise margin, thereby preventing the effects on the write operation. The memory cells may each include more read ports of a similar type, and thus a semiconductor memory having many read ports can be easily achieved.

Figure 16:
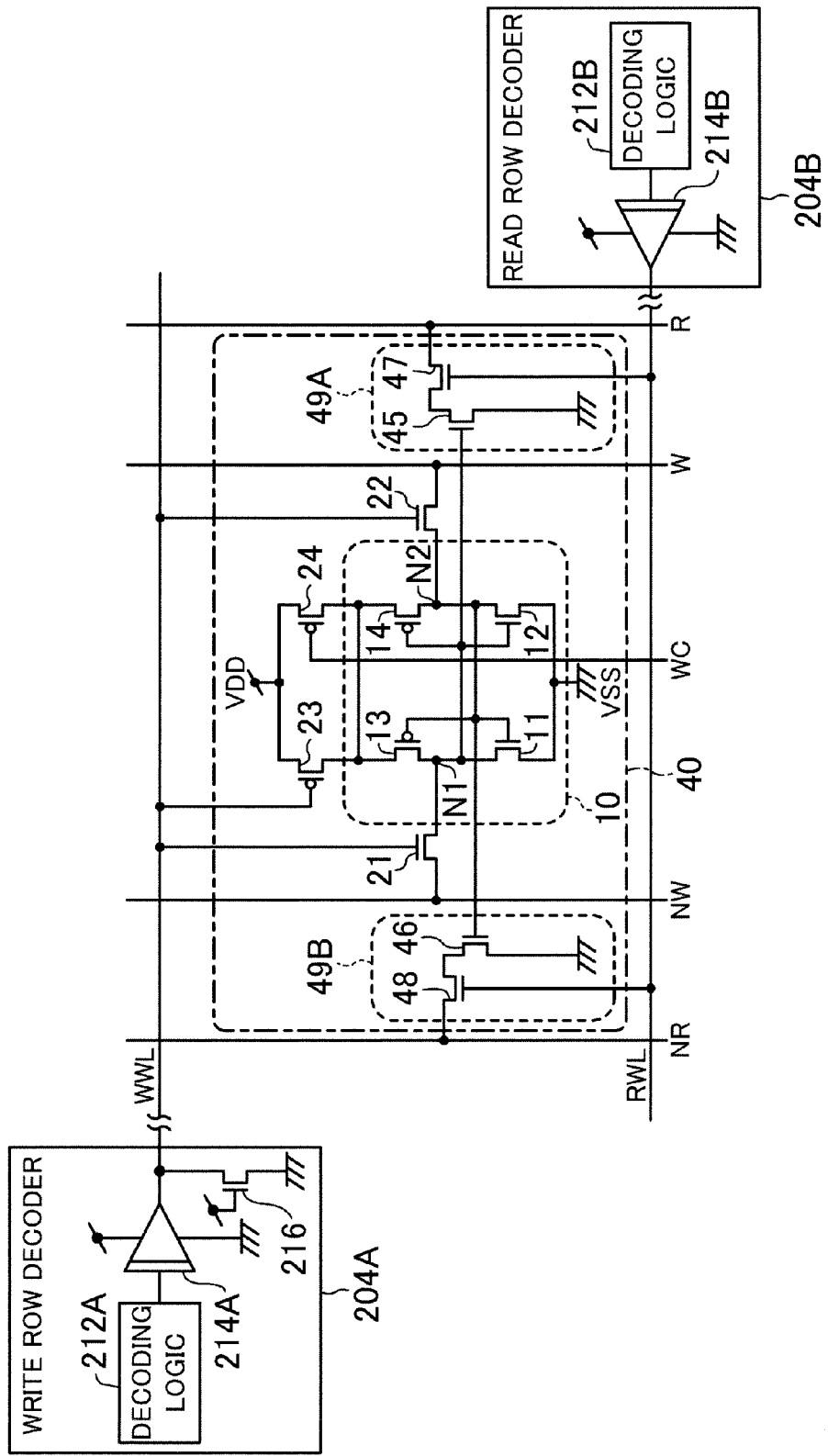
FIG. 16 is a block diagram illustrating an example configuration of the write row decoder and the read row decoder of FIG. 9.

FIG. 16 is a block diagram illustrating an example configuration of the write row decoder 204A and the read row decoder 204B of FIG. 9. The dual-port memory cell of FIG. 9 etc. can achieve high performance by reducing the potential of the write word line WWL in an active state, and by maintaining the potential of the read word line RWL at the potential VDD. The write row decoder 204A includes a decoding logic 212A, an amplifier 214A, and an NMOS transistor 216. The read row decoder 204B includes a decoding logic 212B and an amplifier 214B.

The NMOS transistor 216 pulls down the write word line WWL by a small amount. A slight reduction in the potential of the write word line WWL in an active state facilitates data retention in the memory cell 40C in another column (half-selected cell) during a write operation to the memory cell 40A of FIG. 9. In fact, reductions in the gate-to-source voltages of the access transistors 21 and 22 increase the On resistances, thereby also making it slightly more difficult to perform the write operation on the memory cell 40A. However, since the sources of the load transistors 13 and 14 are cut off, there are no transistors which conflict with the access transistors 21 and 22 in a steady state. Thus, providing a sufficient write pulse width etc. allows a write operation to be performed during a steady state.

Since a half-selected cell can easily ensure the noise margin, the gate widths of the drive transistors 11 and 12 included in the latch 10 of the memory cell can be reduced, thereby allowing the area of the memory cell to be reduced. In addition, if the access transistors 21 and 22 and the drive transistors 11 and 12 are all formed on a same diffusion layer, the entire diffusion region is flush. Therefore, variations in transistor characteristics caused by mask misalignment can be reduced, and thus memory cells can be achieved which are not significantly affected by variations in transistor characteristics. A detailed description of layouts follows.

FIG. 17 is a layout diagram illustrating an example layout of the memory cell 20 of FIG. 2. Transistors are formed within a cell frame 81 on a semiconductor substrate as shown in FIG. 17. PMOS transistors 13, 14, 23, and 24 are formed in an N-well region. NMOS transistors 11, 12, 21, and 22 are formed in a P-well region adjacent to the N-well region. The well boundary is in parallel with the bit lines (in the column-wise direction). The both wells have shapes which are easily processed.

The drive transistors 11 and 12 and the access transistors 21 and 22 are formed in a same diffusion region. The load transistor 13 and the switch 23 are formed in a same diffusion region; the load transistor 14 and the switch 24 are formed in another same diffusion region. Since the nodes of the transistors are coupled to each other in a diffusion layer without an interconnect layer therebetween, the layout of FIG. 17 is advantageous in area efficiency and in yield rate. The shapes of the gate electrodes and of the diffusion layers are nearly linear, and therefore this layout is suitable for processes for fine pattern processing by which complex feature processing is difficult to be implemented.

The gate electrode of the drive transistor 11 and the gate electrode of the load transistor 13 are coupled to each other in a same gate interconnect layer, and the gate electrode of the drive transistor 12 and the gate electrode of the load transistor 14 are coupled to each other in another same gate interconnect layer. This layout provides more space for interconnects in the metal interconnect layer, thereby achieving a reduction in the cell area and a higher yield rate. These gate electrodes are coupled to the respectively corresponding diffusion regions through shared contacts 82.

The direction from the source to the drain of a transistor is parallel with the direction of the well boundary (the vertical direction in FIG. 17) for all the transistors. Thus, by limiting the direction of pocket implantation for forming transistors to the direction of the well boundary, shadowing can be avoided during implantation from a direction perpendicular to the well boundary when the end portions of resist exist near the well boundary, thereby allowing variations in transistor characteristics to be reduced.

The spacing between a P+ well and a P+ diffusion layer and the spacing between an N+ well and an N+ diffusion layer can be reduced, and accordingly the cell area can be reduced. Since bit line contacts 83 and 84 are formed at the top and bottom ends of the cell, two memory cells adjacent to each other in the vertical direction and coupled to a same bit line can share a same bit line contact, thereby allowing the contact areas and the cell area to be reduced. Thus, the bit line capacitance can be reduced, thereby achieving high-speed operations and a reduction in power consumption.

Since the layout of FIG. 17 has a sufficient cell height, this layout is advantageous in that additional clearance is provided for interconnects in the direction of cell height. Due to an approximately square shape of the aspect of the memory cells, a memory cell array configured using memory cells having the layout of FIG. 17 can also be approximately square in shape, thereby allowing the chip layout to be planned easier.

Figure 19:
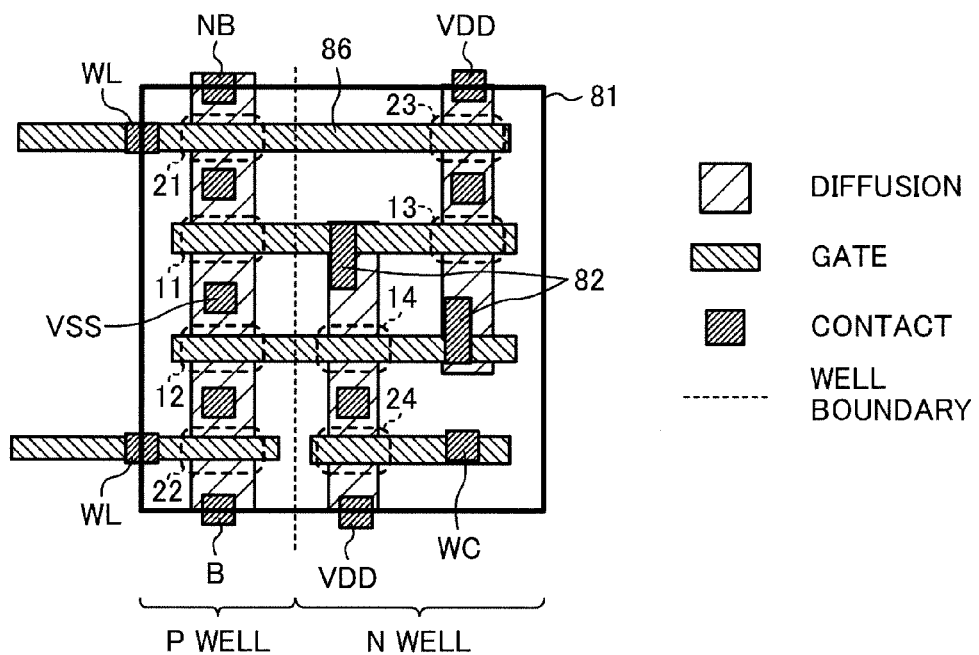
FIG. 19 is a layout diagram illustrating a variation of the layout of FIG. 18.

Referring to a variation of the layout of FIG. 17, optimization of the layout will be described below. FIG. 18 is a layout diagram illustrating an example layout of the memory cell 20 of FIG. 6. In the layout of FIG. 18, the gate electrode of the access transistor 21 and the gate electrode of the switch 23 are coupled to each other in a same gate interconnect layer. That is, the access transistor 21 and the switch 23 share a gate electrode 86. This layout eliminates the need for a contact to the row-control signal line RS. FIG. 19 is a layout diagram illustrating a variation of the layout of FIG. 18.

In the layouts of FIGS. 17 and 18, the ratio (β ratio) of the drive capability of the drive transistor 11 (or 12) to the drive capability of the access transistor 21 (or 22) is achieved by differentiating the gate width. Thus, the width of the diffusion region is changed in a stepwise manner between the drive transistor 11 and the access transistor 21. In practice, semiconductor memories are manufactured such that each portion bent 90 degrees in a region has the corner rounded off to some extent, and thus has a rounded shape. Here, an increase in misalignment between the mask in the diffusion layer and the mask in the gate layer creates an imbalance between the sizes of paired transistors formed in overlapped portions of diffusion layers and gate layers. If a random variation coincides with such a state, memory characteristics become poor, which may cause a large number of corrupted bits.

Thus, in the layout of FIG. 19, the width of the diffusion region is made constant to reduce the effects of mask misalignment. In this case, as described above referring to FIG. 16 for example, the word line potential is reduced to reduce the capabilities of the access transistors, and thus the β ratio is increased.

Figure 20:
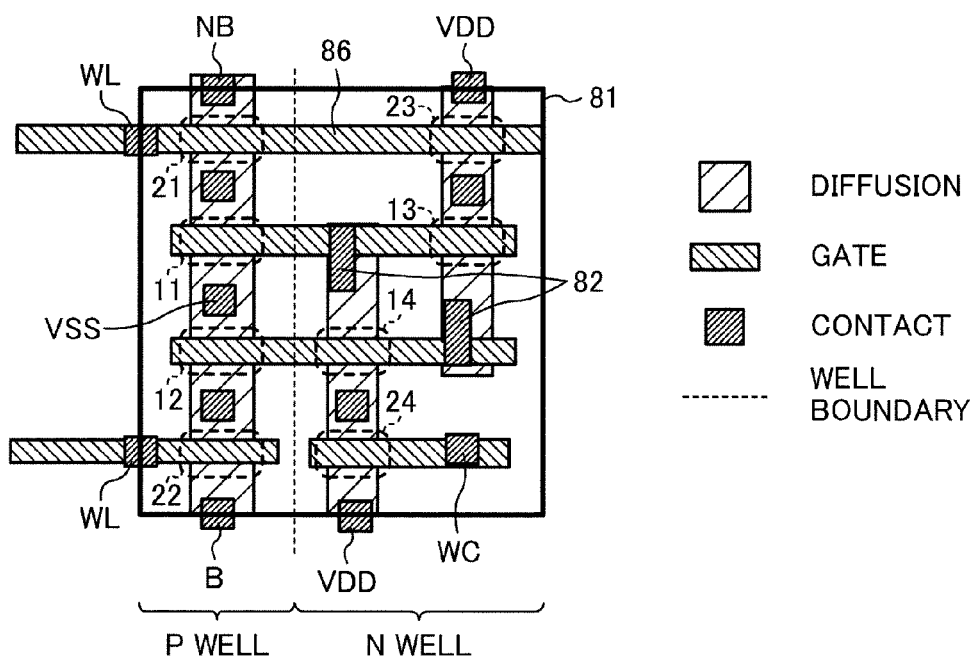
FIG. 20 is a layout diagram illustrating a variation of the layout of FIG. 19.

FIG. 20 is a layout diagram illustrating a variation of the layout of FIG. 19. In the layout of FIG. 20, the right protruding portion of the gate electrode of the switch 23 is extended to an edge of the cell frame 81. Such a layout allows efficient connection with the adjacent memory cell.

Figure 21:
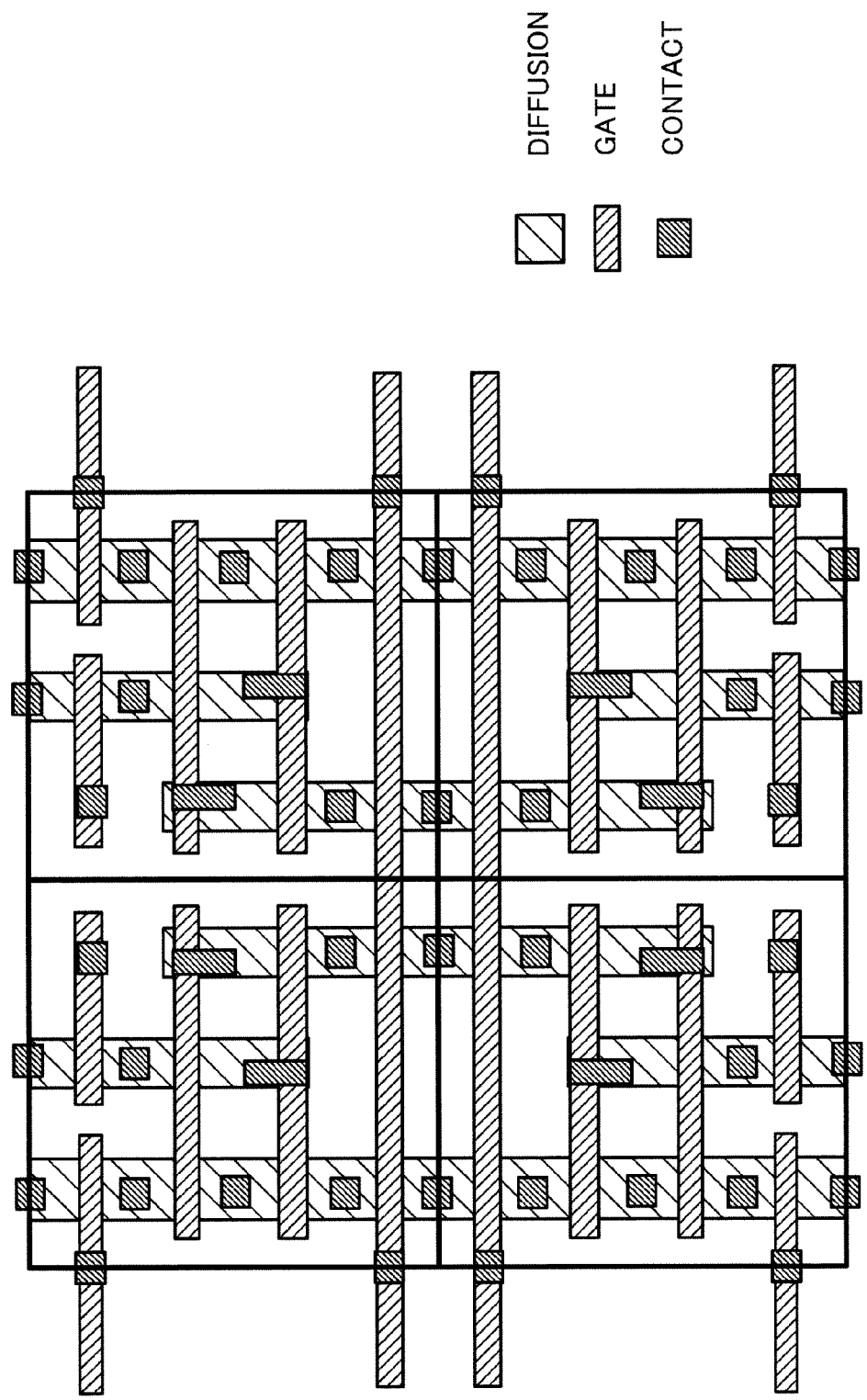
FIG. 21 is a layout diagram illustrating an example layout of a memory cell array, generated by combining the layouts of FIG. 20.

FIG. 21 is a layout diagram illustrating an example layout of a memory cell array, generated by combining the layouts of FIG. 20. Combining the layout of FIG. 20 with the layouts which are respectively flipped horizontally, flipped vertically, and rotated 180 degrees allows the memory cell array to be configured without wasting available space. The gate regions of the word lines WL are continuous in horizontally adjacent memory cells. Since the load transistors 13 and 14 cannot share the gate electrodes thereof with other memory cells, the protruding portions of these gate electrodes do not reach an edge of the cell frame 81.

Figure 22:
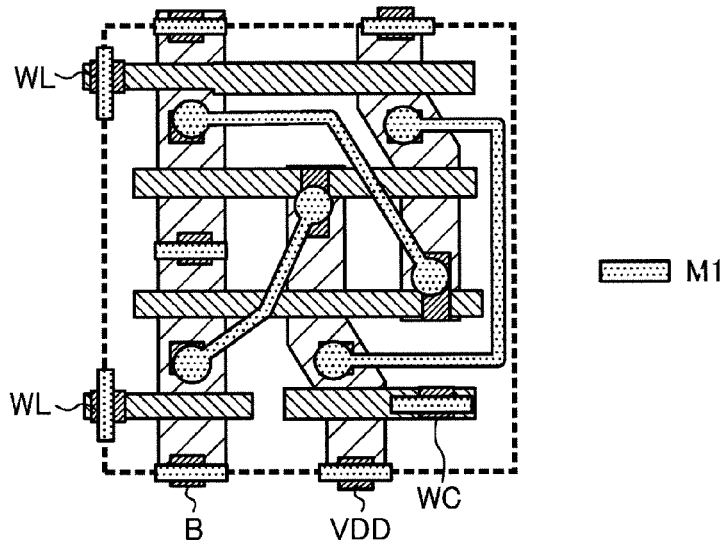
FIG. 22 is a layout diagram illustrating another variation of the layout of FIG. 19.

FIG. 22 is a layout diagram illustrating another variation of the layout of FIG. 19. FIG. 22 also shows interconnects in a first metal interconnect layer M1. As shown in FIG. 22, the diffusion regions where the load transistors 13 and 14 are formed may be bent. In this layout, the diffusion region where the load transistor 13 and the switch 23 are formed is bent such that the portion where the switch 23 is formed is positioned closer to the diffusion region where the load transistor 14 is formed or to an extension thereof. The diffusion region where the load transistor 14 and the switch 24 are formed is bent such that the portion where the switch 24 is formed is positioned closer to the diffusion region where the load transistor 13 is formed or to an extension thereof. Such a layout allows a reduction in the area of the memory cell array, and simultaneously prevents the protruding portion of a gate electrode from being short circuited to other interconnects.

Figure 23:
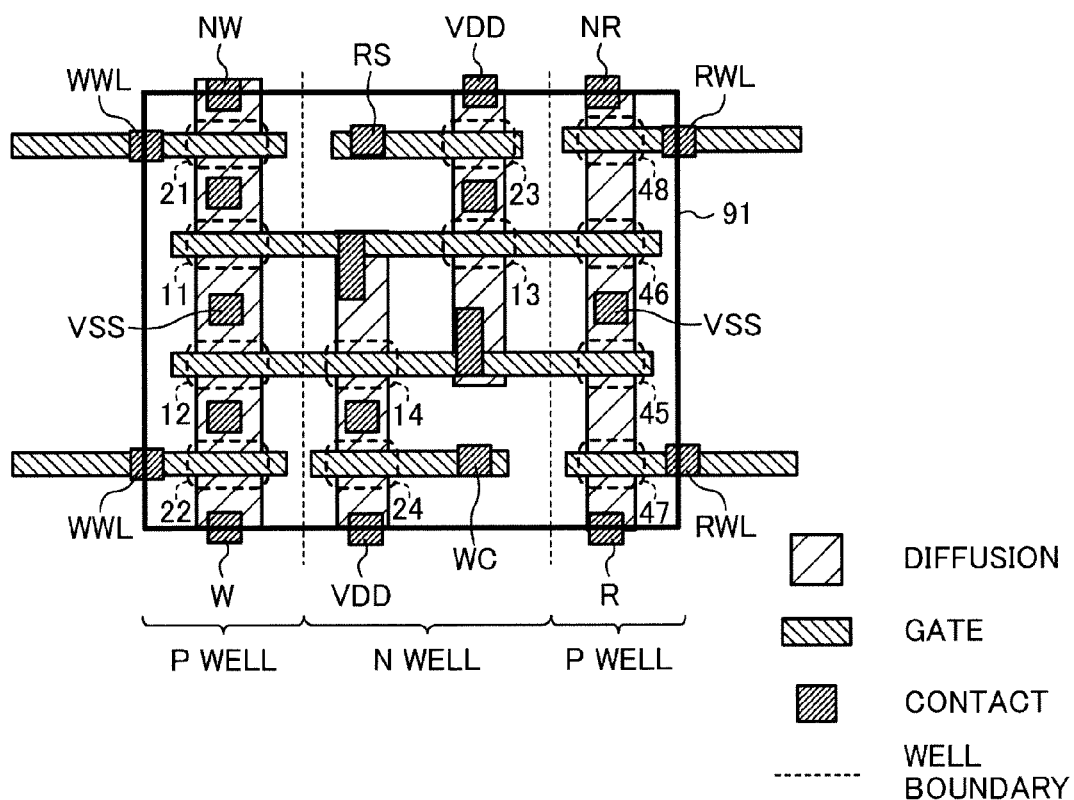
FIG. 23 is a layout diagram illustrating an example layout of the memory cell of FIG. 12.

Next, layouts of multi-port memory cells will be described. FIG. 23 is a layout diagram illustrating an example layout of the memory cell 40 of FIG. 12. Transistors are formed within a cell frame 91 on a semiconductor substrate as shown in FIG. 23.

Figure 24:
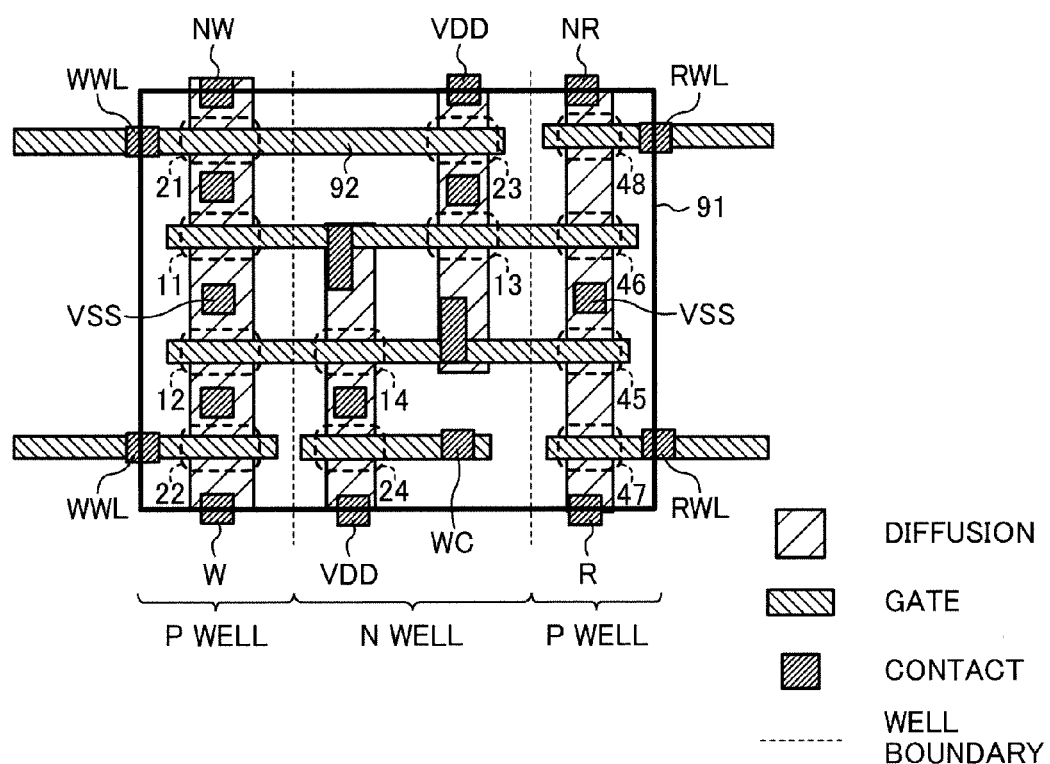
FIG. 24 is a layout diagram illustrating an example layout of a memory cell having the connection arrangement of FIG. 10.

FIG. 24 is a layout diagram illustrating an example layout of a memory cell 40 having the connection arrangement of FIG. 10. The gate electrodes of the access transistor 21 and of the switch 23 are coupled to each other in a same gate interconnect layer, thereby forming a single shared gate electrode 92. Such an arrangement allows a layout suitable for the memory cell of FIG. 10 which uses the word line WWL as the row-control signal line RS.

Also in the layouts of FIGS. 23 and 24, the gate electrodes of the read-port drive transistor 46, of the drive transistor 11, and of the load transistor 13 are coupled to one another in a same gate interconnect layer, thereby forming a single shared region. The gate electrodes of the read-port drive transistor 45, of the drive transistor 12, and of the load transistor 14 are coupled to one another in a same gate interconnect layer, thereby forming another single shared region.

Each of the layouts of FIGS. 23 and 24 provides more space in the metal interconnect layer, thereby achieving a reduction in the cell area and a higher yield rate. These layouts are advantageous especially in multi-port memories having a large number of interconnects.

Figure 25:
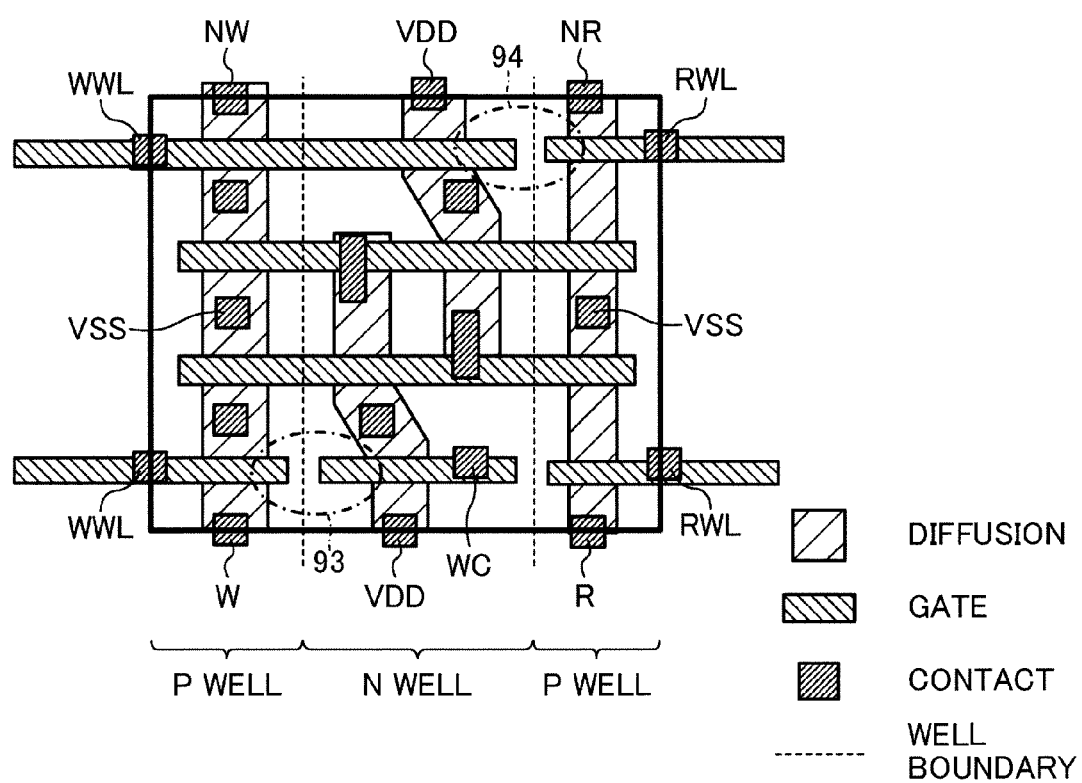
FIG. 25 is a layout diagram illustrating a variation of the layout of FIG. 24.

FIG. 25 is a layout diagram illustrating a variation of the layout of FIG. 24. In the layout of FIG. 25, the diffusion region where the switch 23 and the load transistor 13 are formed is bent such that the portion where the switch 23 is formed is positioned farther from the well boundary, and closer to the center of the N-well region. In addition, the diffusion region where the switch 24 and the load transistor 14 are formed is bent such that the portion where the switch 24 is formed is positioned farther from the well boundary, and closer to the center of the N-well region.

In this layout, the diffusion region where the load transistor 13 and the switch 23 are formed is bent such that the portion where the switch 23 is formed is positioned closer to the diffusion region where the load transistor 14 is formed or to an extension thereof. The diffusion region where the load transistor 14 and the switch 24 are formed is bent such that the portion where the switch 24 is formed is positioned closer to the diffusion region where the load transistor 13 is formed or to an extension thereof.

Such a layout allows sufficient space to be provided between the diffusion region where the load transistor 13 is formed and the diffusion region where the load transistor 14 is formed, and also ensures the spacings in the portions 93 and 94 where the gate electrodes are close to each other, simultaneously allowing the memory cell to be reduced in size, and also allowing the protruding portions of the gate electrodes of the switches 23 and 24 to be ensured sufficiently.

A wide spacing between the diffusion region where the load transistor 13 is formed and the diffusion region where the load transistor 14 is formed prevents an adverse effect on the processability in burying an oxide film into a trench isolation structure. In contrast, a narrow spacing between these diffusion regions and a high aspect ratio of the trench formed between these diffusion regions results in difficulty in filling an oxide film into the trench, thereby increasing the possibility of defects such as a void (vacancy). Also, shared contacts are less likely to be short-circuited due to a sufficient distance between the shared contacts. Since larger distances are provided between the load transistors 13 and 14 and the well boundary, leakage currents between the load transistors 13 and 14 and the P-wells are reduced.

Figure 26:
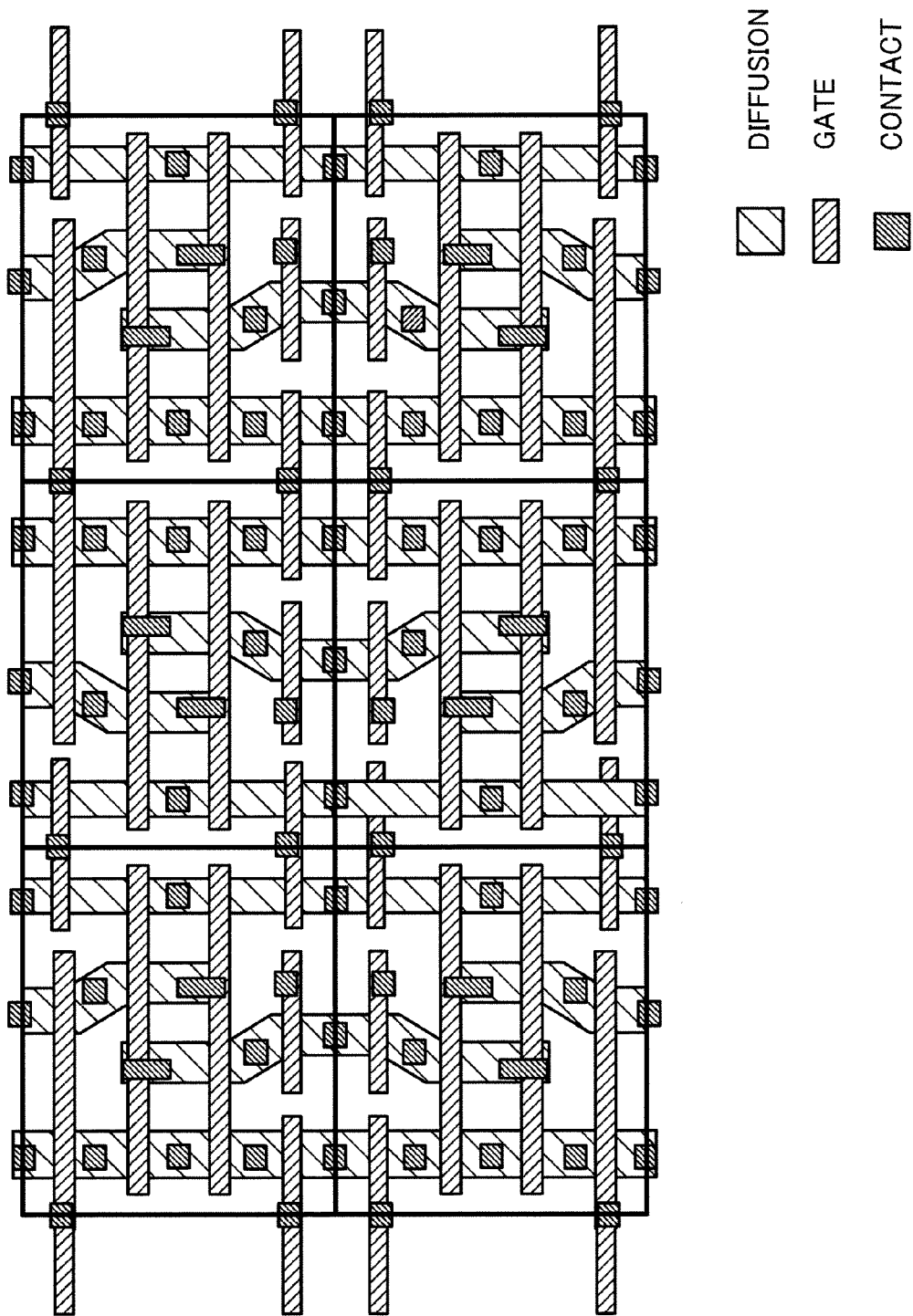
FIG. 26 is a layout diagram illustrating an example layout of a memory cell array, generated by combining the layouts of FIG. 25.

FIG. 26 is a layout diagram illustrating an example layout of a memory cell array, generated by combining the layouts of FIG. 25. Combining the layout of FIG. 25 with the layouts which are respectively flipped horizontally, flipped vertically, and rotated 180 degrees allows the memory cell array to be configured without wasting available space.

Figure 27:
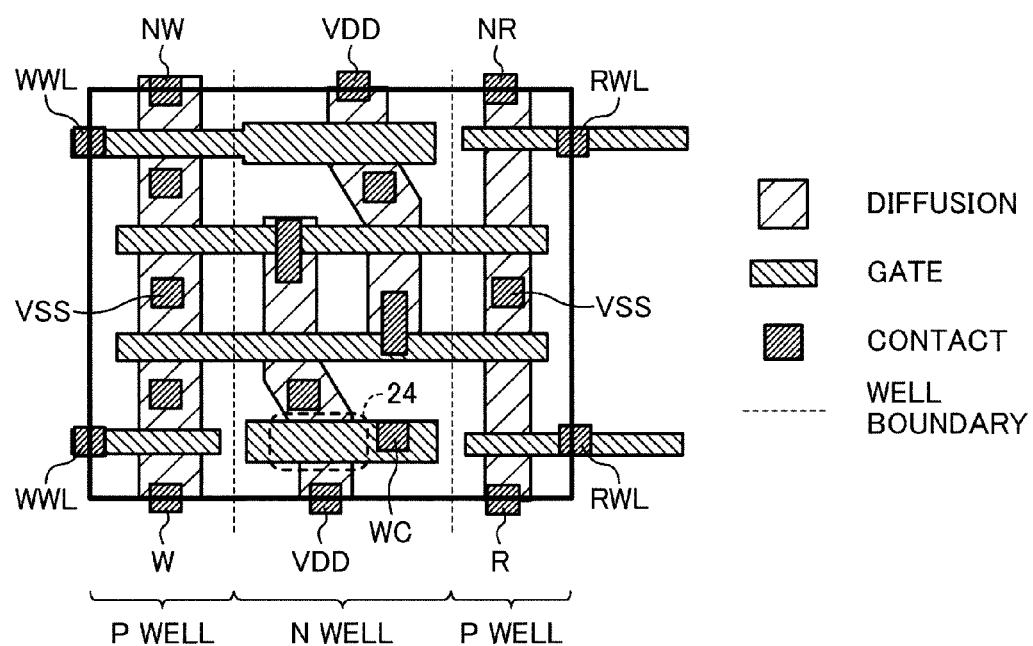
FIG. 27 is a layout diagram illustrating a variation of the layout of FIG. 25.

FIG. 27 is a layout diagram illustrating a variation of the layout of FIG. 25. As can be seen from the layout of FIG. 26, the area of the gate electrode of the switch 24 coupled to the column-control signal line WC is relatively small. A small gate region may cause defects such as removal of resist during the manufacturing process. In order to prevent such defects, as shown in FIG. 27, the width of the gate electrode of the switch 24 (i.e., the gate length of the switch 24) may be increased. If such a layout is used, the gate length of the switch 24 is made longer than at least that of the transistor having the shortest gate length in the same memory cell.

FIG. 28 is a layout diagram illustrating an example layout of a memory cell array, generated by combining the variation of the layout of FIG. 25. By using a gate electrode 96 as shown in FIG. 28, the gate electrodes of the switches 24 in two memory cells adjacent to each other in the column-wise direction may be coupled to each other in a same gate interconnect layer. Since a column-control signal line WC is coupled in common to the memory cells in a same column as shown in FIG. 9, coupling the gate regions, to each other, of the two memory cells adjacent to each other in the column-wise direction causes no logical conflicts, thereby allowing the areas of these gate electrodes to be increased. Moreover, the number of interconnections from the column-control signal lines in the upper layer to the gate electrodes are reduced, thereby creating more space in the metal interconnect layer.

Figure 29:
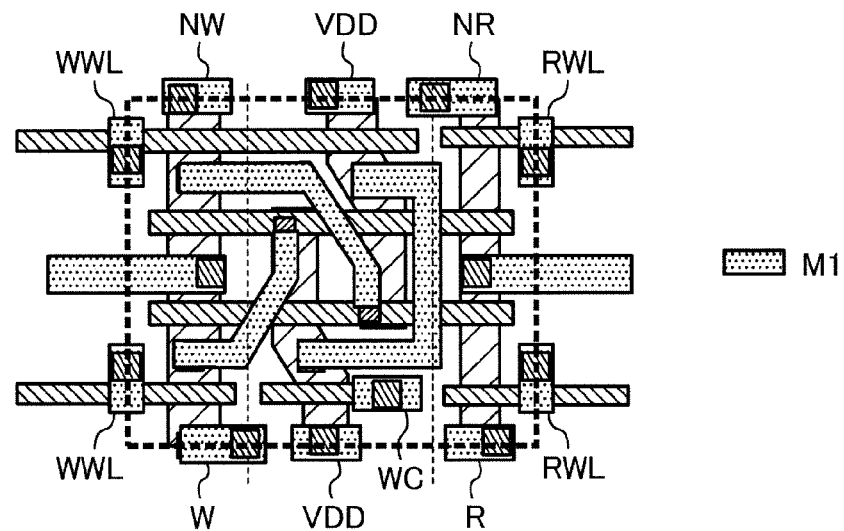
FIG. 29 is a layout diagram illustrating an example interconnect pattern of a first metal interconnect layer in addition to the layout of FIG. 25.
Figure 30:
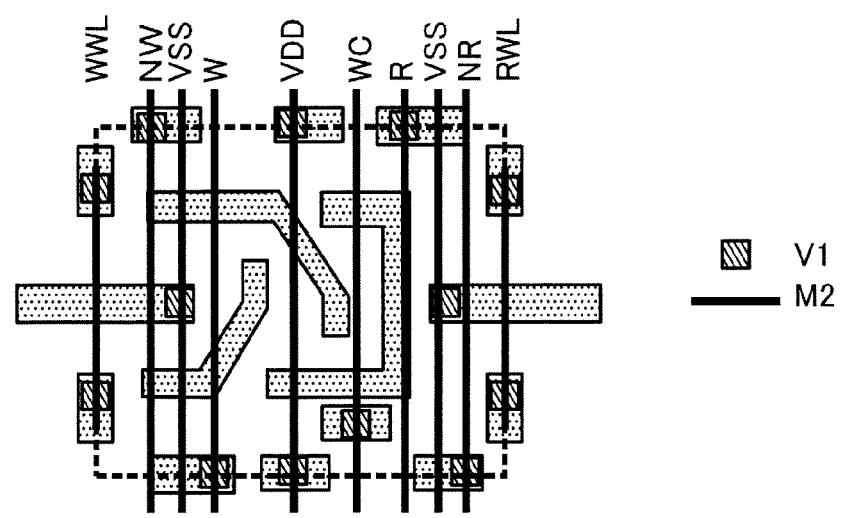
FIG. 30 is a layout diagram illustrating an example interconnect pattern of a second metal interconnect layer with respect to the layout of FIG. 25.
Figure 31:
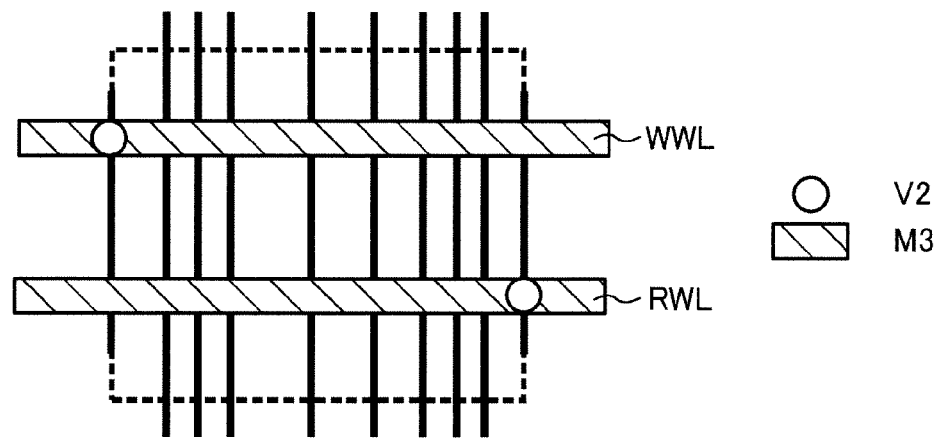
FIG. 31 is a layout diagram illustrating an example interconnect pattern of a third metal interconnect layer with respect to the layout of FIG. 25.

FIG. 29 is a layout diagram illustrating an example interconnect pattern of a first metal interconnect layer M1 in addition to the layout of FIG. 25. FIG. 30 is a layout diagram illustrating an example interconnect pattern of a second metal interconnect layer M2 with respect to the layout of FIG. 25. FIG. 31 is a layout diagram illustrating an example interconnect pattern of a third metal interconnect layer M3 with respect to the layout of FIG. 25. The second metal interconnect layer M2 is disposed over the first metal interconnect layer M1, and the third metal interconnect layer M3 is disposed over the second metal interconnect layer M2. FIG. 30 also shows via holes V1, and FIG. 31 also shows via holes V2.

Reducing the number of metal interconnect layers as far as possible results in a layout which uses a large number of interconnects in the second metal interconnect layer M2 as shown in FIG. 30. Accordingly, the second metal interconnect layer M2 has an increased wiring density, and thus the cell area cannot be reduced.

Figure 32:
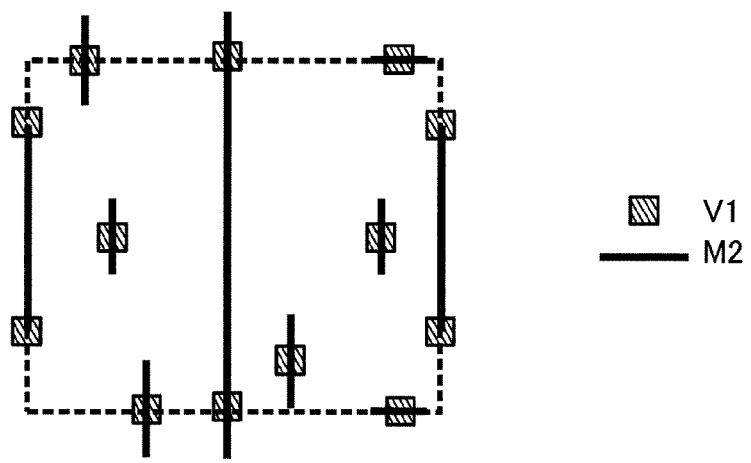
FIG. 32 is a layout diagram illustrating a variation of the layout of FIG. 30.
Figure 33:
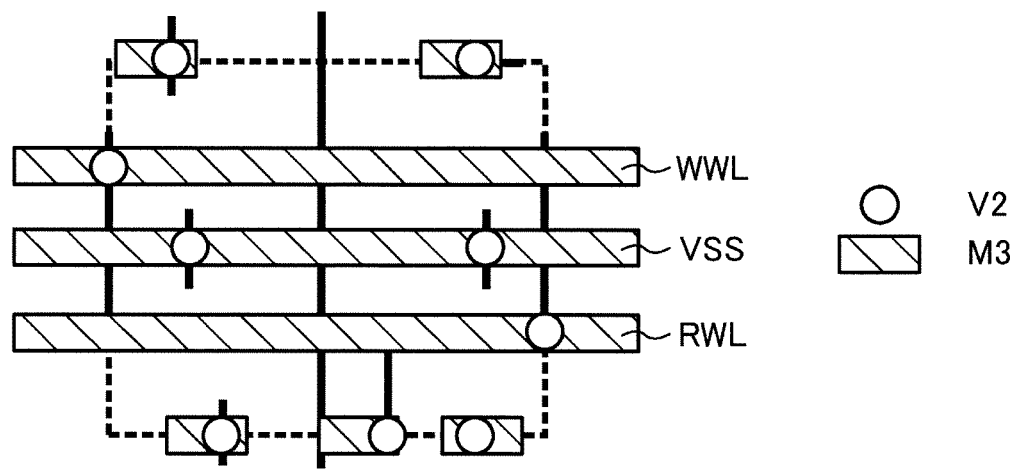
FIG. 33 is a layout diagram illustrating a variation of the layout of FIG. 31.
Figure 34:
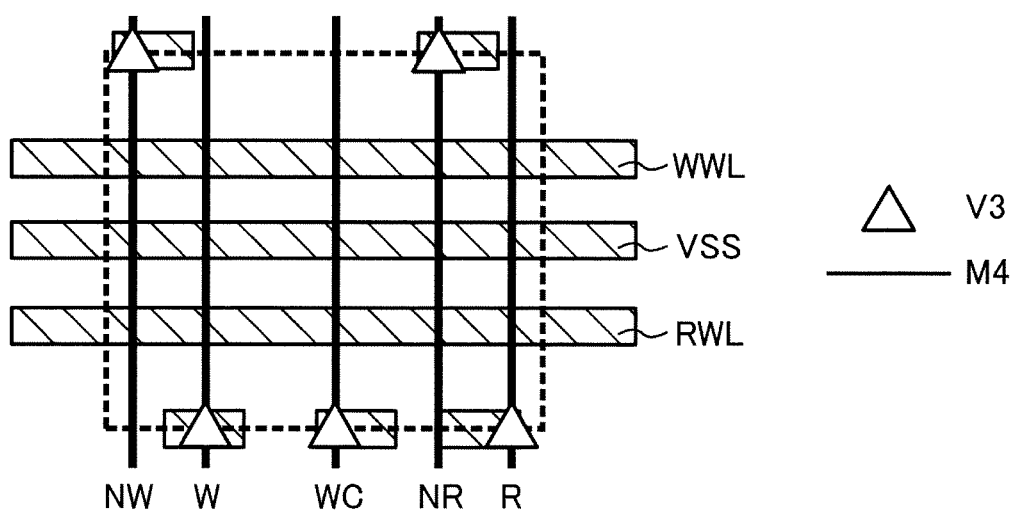
FIG. 34 is a layout diagram illustrating an example interconnect pattern of a fourth metal interconnect layer with respect to the layout of FIG. 25.

FIG. 32 is a layout diagram illustrating a variation of the layout of FIG. 30. FIG. 33 is a layout diagram illustrating a variation of the layout of FIG. 31. FIG. 34 is a layout diagram illustrating an example interconnect pattern of a fourth metal interconnect layer M4 with respect to the layout of FIG. 25. The fourth metal interconnect layer M4 is disposed over the third metal interconnect layer M3. FIG. 34 also shows via holes V3.

The bit lines W, NW, R, and NR, and the column-control signal line WC, which are shared by many memory cells provided in the column-wise direction, are provided so as to extend in the column-wise direction in the fourth metal interconnect layer M4, which is disposed over the first to third metal interconnect layers M1-M3, and are interconnected with the interconnects in the lower layers at the top and bottom edges of the memory cell as if to form bridges. In the third metal interconnect layer M3, the write word line WWL, the read word line RWL, and the power source line having the potential VSS are provided in the center region of the memory cell so as to extend in the row-wise direction. Such a layout facilitates supplying the memory cells with the potential VSS. In the second metal interconnect layer M2, the power source line having the potential VDD is provided so as to extend in the column-wise direction. Using such interconnect topology allows efficient arrangement of interconnects with respect to the layout of FIG. 25.

Figure 35:
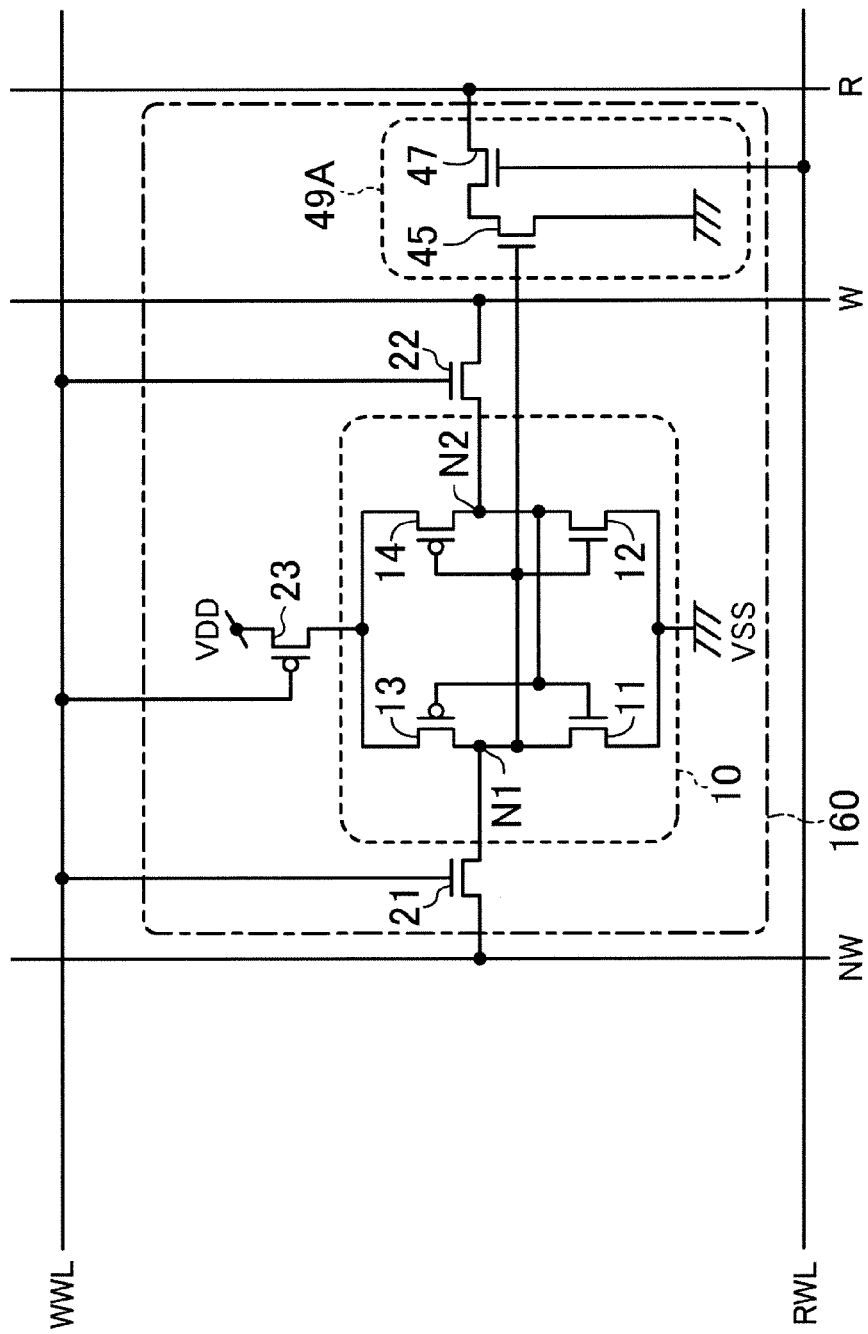
FIG. 35 is a circuit diagram illustrating a configuration of a variation of the memory cell of FIG. 14.

Next, an example of a memory cell which does not include the switch 24 controlled by the column-control signal will be described. FIG. 35 is a circuit diagram illustrating a configuration of a variation of the memory cell 60 of FIG. 14. The semiconductor memory of FIG. 9 may include the memory cells 160 of FIG. 35 instead of the memory cells 40 of FIG. 10. When the write word line WWL is activated, the switch 23 is turned off. Since no current is supplied to the latch 10, a write operation to the memory cell 160 can be easily performed if the bit line is "L" during the write operation.

Relating to a non-write-target memory cell (half-selected cell) coupled to a same word line, the bit lines W and NW are held "H," thereby causing the output nodes N1 and N2 of the latch 10 to be equally affected. Thus, as long as the memory cells are manufactured in a process in a good condition only minimally affected by junction leakage current etc., one of the output nodes N1 and N2 is held "H" and the other is held "L" during a period in which the word line is active as the internal retained charges remain charged to "H" and "L," thereby allowing data to be retained. A reduction of the number of interconnects in the row-wise direction by coupling the switch 23 to the word line for area reduction is advantageous for the layout of a multi-port memory cell having many interconnect layers.

The memory cell 160 of FIG. 35 may also be configured such that the activation potential of the write word line is slightly lower than the potential VDD, and that activation potential of the read word line is the potential VDD. Such a configuration enables a multi-port memory having a reduced area and excellent memory cell characteristics to be configured.

The node N1 is coupled to the gate of the transistor 45. Even when a write operation to a memory cell and a read operation from another memory cell in the same row are concurrently performed, the gate potential of the read-port drive transistor 45 of the read-target memory cell is held "H," thereby posing no problems with the read operation. A concurrent access operation to the memory cell in the same row does not cause a reduction in operation speed. Combination of the memory cell 160 of FIG. 35 with the hierarchical bit line configuration etc. enables a high-speed read operation.

Figure 36:
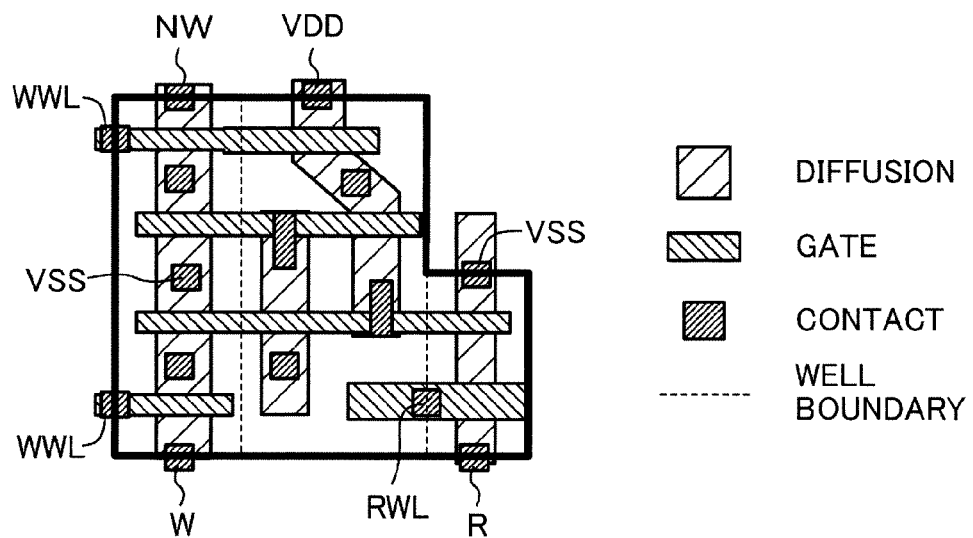
FIG. 36 is a layout diagram illustrating an example layout of the memory cell of FIG. 35.
Figure 37:
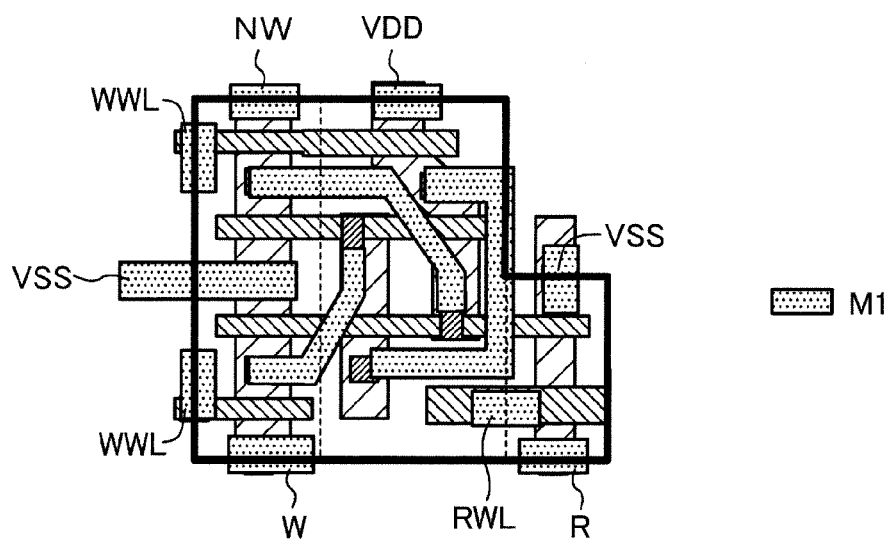
FIG. 37 is a layout diagram illustrating an example interconnect pattern of a first metal interconnect layer in addition to the layout of FIG. 36.

FIG. 36 is a layout diagram illustrating an example layout of the memory cell 160 of FIG. 35. As shown in FIG. 36, the gates of the read-port drive transistor 45, of the drive transistor 12, and of the load transistor 14 are coupled to one another in a same gate interconnect layer, thereby forming a single shared gate electrode. The read-port drive transistor 45 and the read access transistor 47 are formed in a same diffusion region. The memory cell of FIG. 36 has a non-rectangular shape with a protruding portion of the P-well in which the read-port drive transistor 45 and the read access transistor 47 are formed. FIG. 37 is a layout diagram illustrating an example interconnect pattern of a first metal interconnect layer M1 in addition to the layout of FIG. 36.

Figure 38:
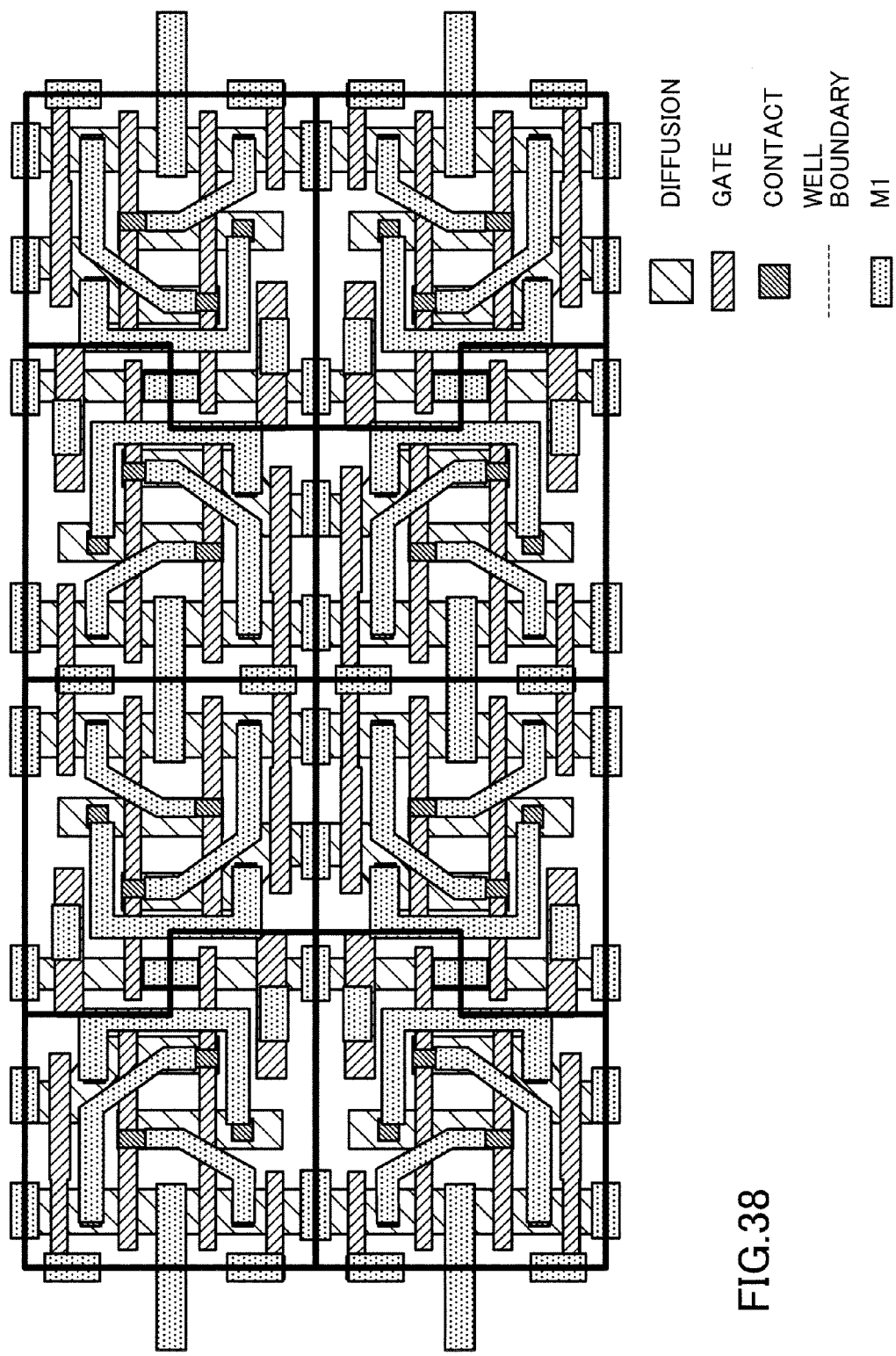
FIG. 38 is a layout diagram illustrating an example layout of a memory cell array, generated by combining the layouts of FIG. 37.

FIG. 38 is a layout diagram illustrating an example layout of a memory cell array, generated by combining the layouts of FIG. 37. In the layout of FIG. 38, diffusion regions where the read-port drive transistors 45 and the read access transistors 47 are formed in two memory cells adjacent to each other in the column-wise direction form a single linear diffusion region. As shown in FIG. 38, the protruding portions of the memory cells can be arranged so as to mate with each other between two adjacent memory cells, thereby allowing a multi-port memory having a significantly small area to be achieved.

Figure 39:
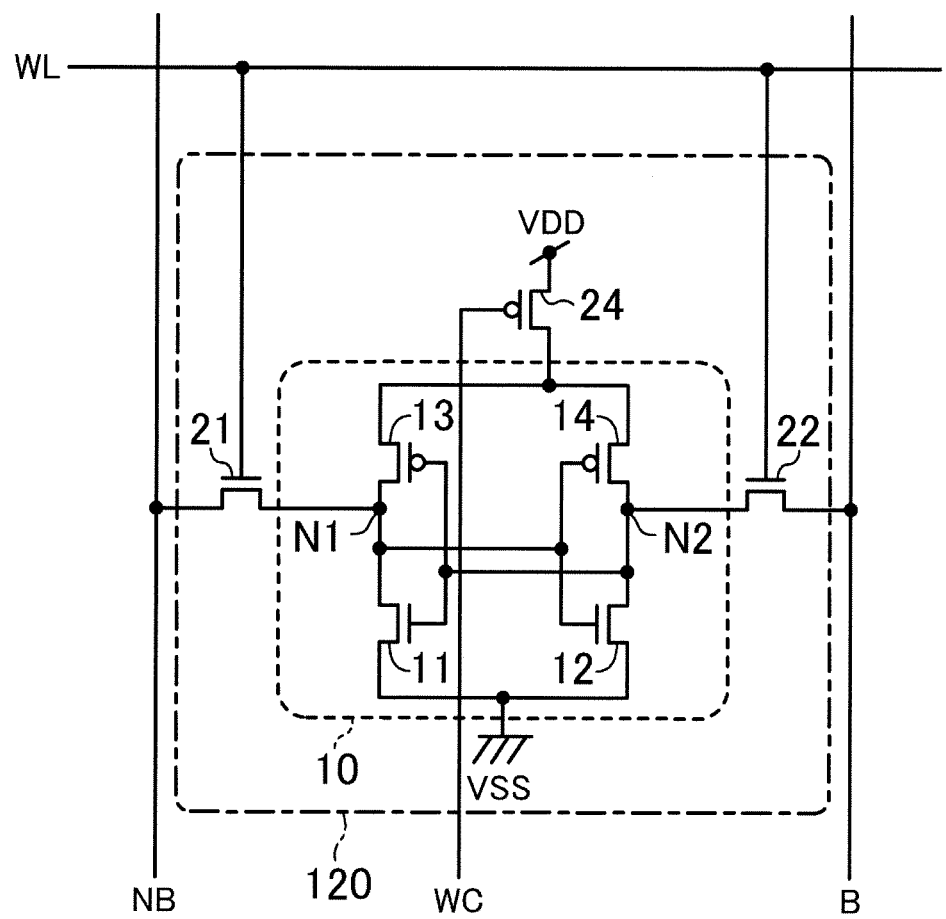
FIG. 39 is a circuit diagram illustrating a configuration of a variation of the memory cell of FIG. 6.

Next, an example of a memory cell which does not include the switch 23 controlled by the row-control signal line or by the word line will be described. FIG. 39 is a circuit diagram illustrating a configuration of a variation of the memory cell 20 of FIG. 6. The semiconductor memory of FIG. 7 may include the memory cell 120 of FIG. 39 instead of the memory cell 20 of FIG. 6. The memory cell 120 includes the switch 24 which operates based on the column-control signal line WC. When the write circuit 8 drives the column-control signal line WC to "H" during a write operation, the switch 24 is turned off. Since no current is supplied to the latch 10, a write operation to the memory cell 120 can be easily performed if the bit line is "L" during the write operation.

If the switch is positioned outside the memory cell array, then the parasitic capacitance of the power source line coupled to the memory cell becomes high. Accordingly, even if the switch is turned off, the switching condition is similar to that in which the source of the load transistor is coupled to the power source, thereby hindering a sufficient facilitation of a write operation to the memory cell. Since the memory cell 120 of FIG. 39 each includes the switch 24, the parasitic capacitance of the interconnects coupled to the sources of the load transistors 13 and 14 in each memory cell is very small, thereby allowing a write operation to the memory cell 120 to be easily performed.

If the switch transistor 24 is cut off, the load transistors 13 and 14 are in a non-driven state in all the memory cells in the same column. In FIG. 7, the data to be next held is written into the write-target memory cell until just before the word line becomes inactive. In contrast, the non-write-target memory cells remains not supplied with load current from the power source during a write operation period. Accordingly, if the memory cells are manufactured in a process with a high amount of junction leakage current etc., an increase of the potential of a node which is "L" and/or a decrease of the potential of a node which is "H" cause the stored data to be inverted or metastable. That is, it is possible that the data may not be able to be retained (the data may be lost).

In order to address this issue, when deactivating the switch 24, the write circuit 8 does not completely cut off the switch 24, but drives the column-control signal line WC to an intermediate potential slightly lower than "H," and applies the intermediate potential to the gate of the switch 24. This countermeasure allows the current required of the latch 10 to maintain a node at the "H" level to be supplied from the switch 24 to the latch 10. Since what is required is a current which overcomes the junction leakage current, the switch 24 is only required to be in a weak On state. A relatively high On resistance of the switch 24 hinders the load transistors 13 and 14, which compete with the access transistors 21 and 22, from functioning also in a write operation, thereby allowing the write operation to be easily performed.

As described above, this example embodiment enables a rewrite operation to memory cells to be easily performed, and the memory cells to have excellent data retention characteristics. Thus, the present invention is useful for semiconductor memories etc.

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A semiconductor memory, comprising:
a plurality of memory cells arranged in a matrix format;
a plurality of word lines each corresponding to a row of the plurality of memory cells, and each coupled to memory cells in the corresponding row;
a plurality of bit line pairs each corresponding to a column of the plurality of memory cells, and each coupled to memory cells in the corresponding column;
a plurality of row-control signal lines each corresponding to a row of the plurality of memory cells; and
a plurality of column-control signal lines each corresponding to a column of the plurality of memory cells,
wherein
the plurality of memory cells each include
a latch having a first and a second inverters, where an input node and an output node of one of the first inverter or the second inverter are respectively coupled to an output node and to an input node of the other one of the first inverter or the second inverter,
a first access transistor having a source coupled to one bit line of a bit line pair which corresponds to that memory cell, of the plurality of bit line pairs, a drain coupled to a first output node which is the output node of the first inverter, and a gate coupled to a word line which corresponds to that memory cell, of the plurality of word lines,
a second access transistor having a source coupled to the other bit line of the bit line pair which corresponds to that memory cell, a drain coupled to a second output node which is the output node of the second inverter, and a gate coupled to the word line which corresponds to that memory cell,
a first switch coupled in series with the latch between a first and a second power sources, and
a second switch coupled in parallel with the first switch,
the first switch is coupled to a row-control signal line which corresponds to that memory cell, of the plurality of row-control signal lines, and
the second switch is coupled to a column-control signal line which corresponds to that memory cell, of the plurality of column-control signal lines.

2. The semiconductor memory of claim 1, further comprising:
a plurality of read word lines each corresponding to a row of the plurality of memory cells, and each coupled to memory cells in the corresponding row; and
a plurality of read bit lines each corresponding to a column of the plurality of memory cells, and each coupled to memory cells in the corresponding column,
wherein
the plurality of memory cells each further include a read port coupled to a corresponding read bit line of the plurality of read bit lines.

3. The semiconductor memory of claim 2, wherein
the read port includes
a read-port drive transistor having a source coupled to the second power source, and a gate coupled to the first output node, and
a read access transistor having a source coupled to a drain of the read-port drive transistor, a drain coupled to the corresponding read bit line, and a gate coupled to a corresponding one of the plurality of read word lines.

4. The semiconductor memory of claim 3, wherein
a potential of the plurality of word lines which are activated is lower than a potential of the first power source, and
a potential of the plurality of read word lines which are activated is the same as the potential of the first power source.

5. The semiconductor memory of claim 3, wherein
the first inverter includes
a load transistor, and
a drive transistor, and
a gate electrode of the read-port drive transistor, a gate electrode of the drive transistor, and a gate electrode of the load transistor are coupled to one another in a same layer.

6. The semiconductor memory of claim 5, wherein
a gate length of the second switch is longer than that of a transistor having a shortest gate length in a same memory cell.
7. The semiconductor memory of claim 5, wherein
gate electrodes of the second switches in two of the memory cells adjacent to each other in a column-wise direction are coupled to each other in a same layer.
8. The semiconductor memory of claim 5, wherein
in a metal interconnect layer, a line for the first power source is provided so as to extend in a column-wise direction,
in another metal interconnect layer disposed over the metal interconnect layer, the word lines and a line for the second power source are provided so as to extend in a row-wise direction, and
in still another metal interconnect layer disposed over the metal interconnect layer in which the word lines are provided, the bit line pairs are provided so as to extend in the column-wise direction.
9. The semiconductor memory of claim 1, wherein
a potential of the plurality of word lines which are activated is lower than a potential of the first power source.
10. The semiconductor memory of claim 1, wherein
when a write mask signal, which indicates that data retained in a memory cell coupled to a predetermined bit line pair of the plurality of bit line pairs is not to be updated, is activated, the second switch of the memory cell coupled to the predetermined bit line pair is turned on.
11. The semiconductor memory of claim 1, wherein
during a standby period of the semiconductor memory, the second switch of a memory cell in a predetermined column, of the plurality of memory cells, is turned off.
12. The semiconductor memory of claim 11, wherein
during the standby period of the semiconductor memory, the first switch of the memory cell in the predetermined column is turned off.
13. The semiconductor memory of claim 12, wherein
during the standby period of the semiconductor memory, a precharge operation to a bit line pair corresponding to the predetermined column is not performed.
14. The semiconductor memory of claim 1, wherein
the first inverter includes
a first load transistor, and
a first drive transistor,
the second inverter includes
a second load transistor, and
a second drive transistor,
a well boundary is in parallel with the bit line pairs,
the first drive transistor and the first access transistor are formed in a same diffusion region,
the first load transistor and the first switch are formed in a same diffusion region, and
a gate electrode of the first drive transistor and a gate electrode of the first load transistor are coupled to each other in a same layer.
15. The semiconductor memory of claim 14, wherein
a gate electrode of either the first or the second access transistor and a gate electrode of the first switch are coupled to each other in a same layer.
16. The semiconductor memory of claim 14, wherein
the diffusion region where the first load transistor and the first switch are formed is bent such that a portion where the first switch is formed is positioned closer to a diffusion region where the second load transistor is formed or to an extension thereof.
17. The semiconductor memory of claim 14, wherein
a gate length of the second switch is longer than that of a transistor having a shortest gate length in a same memory cell.
18. The semiconductor memory of claim 14, wherein
gate electrodes of the second switches in two of the memory cells adjacent to each other in a column-wise direction are coupled to each other in a same layer.
19. The semiconductor memory of claim 14, wherein
in a metal interconnect layer, a line for the first power source is provided so as to extend in a column-wise direction,
in another metal interconnect layer disposed over the metal interconnect layer, the word lines and a line for the second power source are provided so as to extend in a row-wise direction, and
in still another metal interconnect layer disposed over the metal interconnect layer in which the word lines are provided, the bit line pairs are provided so as to extend in the column-wise direction.
20. A semiconductor memory, comprising:
a plurality of memory cells arranged in a matrix format;
a plurality of word lines each corresponding to a row of the plurality of memory cells, and each coupled to memory cells in the corresponding row;
a plurality of bit line pairs each corresponding to a column of the plurality of memory cells, and each coupled to memory cells in the corresponding column; and
a plurality of column-control signal lines each corresponding to a column of the plurality of memory cells,
wherein
the plurality of memory cells each include
a latch having a first and a second inverters, where an input node and an output node of one of the first inverter or the second inverter are respectively coupled to an output node and to an input node of the other one of the first inverter or the second inverter,
a first access transistor having a source coupled to one bit line of a bit line pair which corresponds to that memory cell, of the plurality of bit line pairs, a drain coupled to a first output node which is the output node of the first inverter, and a gate coupled to a word line which corresponds to that memory cell, of the plurality of word lines,
a second access transistor having a source coupled to the other bit line of the bit line pair which corresponds to that memory cell, a drain coupled to a second output node which is the output node of the second inverter, and a gate coupled to the word line which corresponds to that memory cell,
a first switch coupled in series with the latch between a first and a second power sources, and
a second switch coupled in parallel with the first switch,
the first switch is coupled to the word line which corresponds to that memory cell, of the plurality of word lines, and
the second switch is coupled to a column-control signal line which corresponds to that memory cell, of the plurality of column-control signal lines.
21. A semiconductor memory, comprising:
a plurality of memory cells arranged in a matrix format;
a plurality of word lines each corresponding to a row of the plurality of memory cells, and each coupled to memory cells in the corresponding row;
a plurality of bit line pairs each corresponding to a column of the plurality of memory cells, and each coupled to memory cells in the corresponding column; and a plurality of column-control signal lines each corresponding to a column of the plurality of memory cells, wherein the plurality of memory cells each include a latch having a first and a second inverters, where an input node and an output node of one of the first inverter or the second inverter are respectively coupled to an output node and to an input node of the other one of the first inverter or the second inverter, a first access transistor having a source coupled to one bit line of a bit line pair which corresponds to that memory cell, of the plurality of bit line pairs, a drain coupled to a first output node which is the output node of the first inverter, and a gate coupled to a word line which corresponds to that memory cell, of the plurality of word lines, a second access transistor having a source coupled to the other bit line of the bit line pair which corresponds to that memory cell, a drain coupled to a second output node which is the output node of the second inverter, and a gate coupled to the word line which corresponds to that memory cell, and a switch coupled in series with the latch between a first and a second power sources, and the switch is coupled to a corresponding column-control signal line which corresponds to that memory cell, of the plurality of column-control signal lines.

22. The semiconductor memory of claim 21, wherein when the switch is inactive, a potential of the corresponding column-control signal line is lower than a potential of the first power source, and is higher than a potential of the second power source.

* * * * *